US012073287B2

(12) United States Patent
Das et al.

(10) Patent No.: US 12,073,287 B2
(45) Date of Patent: Aug. 27, 2024

(54) SYSTEMS FOR COUPLING DECODERS TO QUANTUM REGISTERS

(71) Applicant: Microsoft Technology Licensing, LLC, Redmond, WA (US)

(72) Inventors: Poulami Das, Atlanta, GA (US); Nicolas Guillaume Delfosse, Bellevue, WA (US); Christopher Anand Pattison, Seattle, WA (US); Srilatha Manne, Seattle, WA (US); Douglas Carmean, Seattle, WA (US); Krysta Marie Svore, Seattle, WA (US); Helmut Gottfried Katzgraber, Kirkland, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 1026 days.

(21) Appl. No.: 16/687,469

(22) Filed: Nov. 18, 2019

(65) Prior Publication Data

US 2021/0042651 A1    Feb. 11, 2021

Related U.S. Application Data

(60) Provisional application No. 62/883,514, filed on Aug. 6, 2019.

(51) Int. Cl.
*G06N 10/00* (2022.01)
*G06F 9/30* (2018.01)
(Continued)

(52) U.S. Cl.
CPC ......... *G06N 10/00* (2019.01); *G06F 9/30098* (2013.01); *G06F 9/30145* (2013.01);
(Continued)

(58) Field of Classification Search
CPC .............................. G06N 10/00; G06N 10/40
See application file for complete search history.

(56) References Cited

U.S. PATENT DOCUMENTS 5,768,297 A    6/1998   Shor
11,410,070 B2  8/2022   Das et al.
(Continued)

FOREIGN PATENT DOCUMENTS

CN    108780129 A    11/2018
CN    109643710 A     4/2019
(Continued)

OTHER PUBLICATIONS

"Quantum Computing: Progress and Prospects (2019)", In the National Academies of Sciences, Engineering and Medicine, Chapter 7, 2019, 38 Pages.
(Continued)

*Primary Examiner* — Markus A. Vasquez
(74) *Attorney, Agent, or Firm* — Alleman Hall & Tuttle LLP

(57) ABSTRACT

A quantum computing device comprises at least one quantum register including l logical qubits, where l is a positive integer. The quantum computing device further includes a set of d decoder blocks coupled to the at least one quantum register, where d<2*l. In this way, the decoder blocks may share decoding requests generated by the logical qubits.

19 Claims, 31 Drawing Sheets

(51) Int. Cl.

| | |
|---|---|
| *G06F 9/38* | (2018.01) |
| *G06F 9/50* | (2006.01) |
| *G06F 18/2323* | (2023.01) |
| *G06N 10/40* | (2022.01) |
| *G06N 10/60* | (2022.01) |
| *G06N 10/70* | (2022.01) |
| *G06N 10/80* | (2022.01) |
| *H03M 13/00* | (2006.01) |
| *H03M 13/15* | (2006.01) |

(52) U.S. Cl.
CPC ............ *G06F 9/382* (2013.01); *G06F 9/3861* (2013.01); *G06F 9/3869* (2013.01); *G06F 9/5016* (2013.01); *G06F 18/2323* (2023.01); *G06N 10/40* (2022.01); *G06N 10/60* (2022.01); *G06N 10/70* (2022.01); *G06N 10/80* (2022.01); *H03M 13/1575* (2013.01); *H03M 13/611* (2013.01)

(56) References Cited

U.S. PATENT DOCUMENTS

| | | | |
|---|---|---|---|
| 2003/0093451 | A1 | 5/2003 | Chuang et al. |
| 2016/0344414 | A1 | 11/2016 | Naaman et al. |
| 2018/0359086 | A1 | 12/2018 | Dixon et al. |
| 2019/0042971 | A1 | 2/2019 | Zou |
| 2020/0067528 | A1 | 2/2020 | Arikan |
| 2020/0119748 | A1 | 4/2020 | Lucarelli |
| 2020/0285539 | A1 | 9/2020 | Fowler |
| 2020/0401927 | A1 | 12/2020 | Nickerson et al. |
| 2021/0042650 | A1 | 2/2021 | Das et al. |
| 2021/0042652 | A1 | 2/2021 | Das et al. |
| 2021/0124640 | A1* | 4/2021 | Nickerson ............... G06N 10/00 |
| 2021/0232963 | A1 | 7/2021 | Gimeno-Segovia et al. |
| 2022/0385306 | A1 | 12/2022 | Das et al. |
| 2023/0359912 | A1 | 11/2023 | Das et al. |

FOREIGN PATENT DOCUMENTS

| | | |
|---|---|---|
| JP | H06225162 A | 8/1994 |
| JP | 2008508835 A | 3/2008 |
| JP | 2014241484 A | 12/2014 |
| JP | 2016504002 A | 2/2016 |
| JP | 2016521100 A | 7/2016 |
| JP | 2017522797 A | 8/2017 |
| JP | 2018516020 A | 6/2018 |
| WO | 2015132914 A1 | 9/2015 |
| WO | 2019032103 A1 | 2/2019 |

OTHER PUBLICATIONS

"Non Final Office Action Issued in U.S. Appl. No. 16/685,863", dated Jul. 21, 2022, 11 Pages.

Ball, Philip, "First 100-Qubit Quantum Computer Enters Crowded Race", In Journal of Nature, vol. 599, Issue 7886, Nov. 25, 2021, 1 Page.

Horgan, John, "Will Quantum Computing Ever Live Up to Its Hype?", In Journal of Scientific American, Apr. 20, 2021, 6 Pages.

Presikill, John, "Quantum Computing in the NISQ era and beyond", In Repository of arXiv:1801.00862v3, Jul. 31, 2018, 20 Pages.

Breuckmann, et al., "Scalable Neural Network Decoders for Higher Dimensional Quantum Codes", Retrieved from: https://arxiv.org/pdf/1710.09489.pdf, Oct. 26, 2017, 24 Pages.

Das, et al., "A Scalable Decoder Micro-architecture for Fault-Tolerant Quantum Computing", Retrieved from: https://arxiv.org/pdf/2001.06598.pdf, Jan. 18, 2020, 19 Pages.

Homulle, et al., "CryoCMOS hardware technology a classical infrastructure for a scalable quantum computer", In Proceedings of the ACM International Conference on Computing Frontiers, May 16, 2016, pp. 282-287.

Krastanov, et al., "Deep Neural Network Probabilistic Decoder for Stabilizer Codes", In Scientific Reports, vol. 7, Issue 1, Dec. 1, 2017, 10 Pages.

"International Search Report and Written Opinion Issued in PCT Application No. PCT/US2020/036834", dated Nov. 20, 2020, 30 Pages.

"International Search Report and Written Opinion Issued in PCT Application No. PCT/US2020/036844", dated Nov. 13, 2020, 30 Pages.

"International Search Report and Written Opinion Issued in PCT Application No. PCT/US2020/036847", dated Nov. 20, 2020, 30 Pages.

Varsamopoulos, et al., "Decoding Small Surface Codes with Feedforward Neural Network", Retrieved from: https://arxiv.org/pdf/1705.00857.pdf, May 2, 2017, 13 Pages.

"Quantum Computing at IBM", Retrieved from: https://www.ibm.com/quantum-computing/learn/what-is-ibm-q/, Retrieved Date: Nov. 29, 2019, 9 Pages.

"Quantum Computing Playground", Retrieved from: https://opensource.google/projects/quantum-computing-playground, Retrieved Date: Nov. 29, 2019, 2 Pages.

"Rigetti Quantum Cloud Services", Retrieved from: https://web.archive.org/web/20190102204644/https://www.rigetti.com/, Retrieved Date: Dec. 28, 2018, 6 Pages.

Aharonov, et al., "Fault-tolerant Quantum Computation with Constant Error Rate", In Journal of SIAM Journal on Computing, vol. 38, Issue 4, Jul. 2008, pp. 1207-1282.

Alameldeen, et al., "Adaptive Cache Compression for High-Performance Processors", In Journal of ACM SIGARCH Computer Architecture News, vol. 32, No. 2, Mar. 2, 2004, 12 Pages.

Aliferis, et al., "Quantum Accuracy Threshold for Concatenated Distance-3 Codes", In Repository of arXiv:quant-ph/0504218, Apr. 28, 2005, 58 Pages.

Bardin, et al., "29.1 A 28nm Bulk-CMOS 4-to-8GHz i2mW Cryogenic Pulse Modulator for Scalable Quantum Computing", In Proceedings of the IEEE International Solid-State Circuits Conference—(ISSCC), Feb. 17, 2019, pp. 456-458.

Brown, et al., "Using Quantum Computers for Quantum Simulation", In Journal of Entropy, vol. 12, No. 11, Nov. 15, 2010, pp. 2268-2307.

Burnett, et al., "Demonstration of Superconducting Memory for an RQL CPU", In Proceedings of the International Symposium on Memory Systems, Oct. 1, 2018, 3 Pages.

Calderbank, et al., "Good Quantum Error-Correcting Codes Exist", In Journal of Physical Review A, vol. 54, No. 2, Aug. 1, 1996, 24 Pages.

Castelvecchi, Davide, "IBM's Quantum Cloud Computer goes Commercial", In Journal of Nature News, vol. 543, No. 7644, Mar. 9, 2017, 4 Pages.

Chamberland, et al., "Fault-Tolerant Quantum Computing in the Pauli or Clifford Frame with Slow Error Diagnostics", In Repository of arXiv: 1704.06662v2, Dec. 25, 2017, 11 Pages.

Delfosse, et al., "Almost-Linear Time Decoding Algorithm for Topological Codes", In Repository of arXiv:1709.06218, Sep. 19, 2017, 10 Pages.

Delfosse, et al., "Linear-Time Maximum Likelihood Decoding of Surface Codes Over the Quantum Erasure Channel", In Journal of the Computing Research Repository, Mar. 4, 2017, 5 Pages.

Dennis, et al., "Topological Quantum Memory", In Journal of Mathematical Physics, vol. 43, Issue 9, Sep. 2002, pp. 4452-4505.

Feynman, Richard P., "Simulating Physics with Computers", In International Journal of Theoretical Physics, vol. 21, Issue 6, Jun. 1, 1982, pp. 467-488.

Fowler, et al., "Surface Codes: Towards Practical Large-Scale Quantum Computation", In Journal of Physical Review A, vol. 86, Issue 3, Sep. 18, 2012, 54 Pages.

Fu, et al., "An Experimental Microarchitecture for a Superconducting Quantum Processor", In Proceedings of the 50th Annual IEEE/ACM International Symposium on Microarchitecture, Oct. 14, 2017, pp. 813-825.

Gottesman, Daniel, "An Introduction to Quantum Error Correction and Fault-Tolerant Quantum Computation", In Proceedings of the Symposia in Applied Mathematics, vol. 68, Apr. 2010, 46 Pages.

(56) References Cited

OTHER PUBLICATIONS

Gottesman, Daniel, "Stabilizer Codes and Quantum Error Correction", In Repository of arXiv: quant-ph/9705052v1, May 28, 1997, 122 Pages.

Grover, Lov K., "A Fast Quantum Mechanical Algorithm for Database Search", In Proceedings of the twenty-eighth annual ACM symposium on Theory of Computing, May 29, 1996, pp. 212-219.

Herr, et al., "Ultra-Low-Power Superconductor Logic", In Journal of Applied Physics, vol. 109, Issue 10, May 15, 2011, pp. 1-7.

Holmes, et al., "Energy-Efficient Superconducting Computing-Power Budgets and Requirements", In Journal of IEEE Transactions on Applied Superconductivity, vol. 23, Issue 3, Feb. 4, 2013, 10 Pages.

Hornibrook, et al., "Cryogenic Control Architecture for Large-Scale Quantum Computing", In Journal of Physical Review Applied, vol. 3, Issue 2, Feb. 23, 2015, 8 Pages.

Hsieh, et al., "NP-Hardness of Decoding Quantum Error-Correction Codes", In Journal of Physical Review A, vol. 83, No. 5, May 31, 2011, 5 Pages.

Iyer, et al., "Hardness of Decoding Quantum Stabilizer Codes", In Proceedings of the IEEE Transactions on Information Theory, vol. 61, Issue 9, Apr. 28, 2015, pp. 5209-5223.

Jaffe, et al., "A New Diagrammatic Approach to Quantum Information", Retrieved from: http://www.arthurjaffe.com/Assets/pdf/New%20Approach.pdf, Sep. 17, 2016, 5 Pages.

Kelly, et al., "Some Like It Cold: Initial Testing Results for Cryogenic Computing Components", In Journal of Physics: Conference Series, vol. 1182, No. 1, Feb. 2019, 9 Pages.

Kim, et al., "Bit-plane Compression: Transforming Data for Better Compression in Many-Core Architectures", In Proceedings of ACM/IEEE 43rd Annual International Symposium on Computer Architecture (ISCA), Jun. 18, 2016, pp. 329-340.

Kitaev, A Yu., "Fault-Tolerant Quantum Computation by Anyons", In Journal of Annals of Physics, vol. 303, Issue 1, Jan. 1, 2003, 29 Pages.

Knight, Will, "IBM Raises the Bar with a 50-Qubit Quantum Computer", Retrieved from: https://www.technologyreview.com/s/609451/ibm-raises-the-bar-with-a-50-qubit-quantum-computer/, Nov. 10, 2017, 4 Pages.

Knill, et al., "Concatenated Quantum Codes", In Repository of arXiv: quant-ph/9608012, Aug. 8, 1996, 16 Pages.

Kuo, et al., "On the Hardness of Decoding Quantum Stabilizer Codes under the Depolarizing Channel", In Proceedings of the International Symposium on Information Theory and its Applications, Oct. 28, 2012, pp. 208-211.

Nagasawa, "Design of All-Dc-Powered High-Speed Single Flux Quantum Random Access Memory Based on a Pipeline Structure for Memory Cell Arrays", In Journal of Superconductor Science and Technology, vol. 19, No. 5, Mar. 16, 2006.

Nagasawa, et al., "Yield Evaluation of 10-kA/cm 2 Nb Multi-Layer Fabrication Process Using Conventional Superconducting RAMs", In Journal of IEEE Transactions on Applied Superconductivity, vol. 17, Issue 2, Jul. 23, 2007, pp. 177-180.

Pekhimenko, et al., "Base-Delta-Immediate Compression: Practical Data Compression for On-Chip Caches", In Proceedings of the 21st International Conference on Parallel Architectures and Compilation Techniques, Sep. 19, 2012, pp. 377-388.

Pekhimenko, et al., "Linearly Compressed Pages: A Low-Complexity, Low-Latency Main Memory Compression Framework", In Proceedings of the 46th Annual IEEE/ACM International Symposium on Microarchitecture (MICRO), Dec. 7, 2013, pp. 172-184.

Preskill, John, "Quantum Error Correction", Retrieved from: http://www.theory.caltech.edu/people/preskill/ph229/notes/chap7.pdf, 1999, 92 Pages.

Reiher, et al., "Elucidating Reaction Mechanisms on Quantum Computers", In Proceedings of the National Academy of Sciences, vol. 114, No. 29, Jul. 3, 2017, pp. 7555-7560.

Shor, Peter W., "Fault-Tolerant Quantum Computation", In Proceedings of 37th Conference on Foundations of Computer Science, Oct. 14, 1996, pp. 56-65.

Shor, Peter W., "Polynomial-Time Algorithms for Prime Factorization and Discrete Logarithms on a Quantum Computer", In Journal of SIAM Review, vol. 41, No. 2, Apr. 23, 1999, pp. 303-332.

Shor, Peter W., "Scheme for Reducing Decoherence in Quantum Computer Memory", In Journal of Physical review A, vol. 52, No. 4, Oct. 1, 1995, 4 Pages.

Steane, Andrew W., "Multiple-Particle Interference and Quantum Error Correction", In Proceedings of the Royal Society of London. Series A: Mathematical, Physical and Engineering Sciences, Nov. 8, 1996, pp. 2551-2577.

Tannu, et al., "Taming the Instruction Bandwidth of Quantum Computers via Hardware-Managed Error Correction", In Proceedings of the 50th Annual IEEE/ACM International Symposium on Microarchitecture (MICRO), Oct. 14, 2017, pp. 679-691.

Tomita, et al., "Low-distance Surface Codes under Realistic Quantum Noise", In Journal of Physical Review A, vol. 90, No. 6, Dec. 11, 2014, 15 Pages.

Torlai, et al., "A Neural Decoder for Topological Codes", In Journal of Physical Review Letters, vol. 119, No. 3, Jul. 18, 2017, 6 Pages.

Villa, et al., "Dynamic Zero Compression for Cache Energy Reduction", In Proceedings of the 33rd annual ACM/IEEE international symposium on Microarchitecture, Dec. 10, 2000, pp. 214-220.

Wootters, et al., "A Single Quantum Cannot be Cloned", In Journal of Nature, vol. 299, No. 5886, Oct. 28, 1982, pp. 802-803.

Zhao, et al., "Buri: Scaling Big-Memory Computing with Hardware-based Memory Expansion", In Journal of ACM Transactions on Architecture and Code Optimization (TACO), vol. 12, Issue 3, Oct. 6, 2015, 24 Pages.

"Non Final Office Action Issued in U.S. Appl. No. 17/818,137", dated Nov. 23, 2022, 8 Pages.

"Notice of Allowance Issued in U.S. Appl. No. 16/687,517", dated Apr. 6, 2022, 9 Pages.

"Notice of Allowance Issued in U.S. Appl. No. 17/818,137", dated Apr. 26, 2023, 8 Pages.

Final Office Action Issued in U.S. Appl. No. 16/685,863, dated Jan. 13, 2023, 11 Pages.

Dong, et al., "Ground-State Preparation and Energy Estimation on Early Fault-Tolerant Quantum Computers via Quantum Eigenvalue Transformation of Unitary Matrices", In Repository of arXiv:2204.05955v2, Oct. 18, 2022, 36 Pages.

Notice of Allowance mailed on May 9, 2024, in U.S. Appl. No. 18/351,666, 8 pages.

Communication 94(3) Received for European Application No. 20740104.3, mailed on Apr. 17, 2024, 5 pages.

Communication pursuant to Article 94(3) Received for European Application No. 20750526.4, mailed on Apr. 23, 2024, 10 pages.

Communication pursuant to Article 94(3) received in European Application No. 20751338.3, mailed on Apr. 24, 2024, 8 pages.

Office Action Received for Japanese Application No. 2022-506579, mailed on May 28, 2024, 4 pages (English Translation Provided).

Office Action Received for Japanese Application No. 2022-506581, mailed on May 28, 2024, 6 pages (English Translation Provided).

Decision to grant a patent received for Japanese Application No. 2022-506575, mailed on Jun. 11, 2024, 05 pages (English Translation Provided).

Notification of First Office Action and Search Report received for Chinese Application No. 202080055659.0, mailed on Jun. 5, 2024, 17 pages. (English Translation Provided).

Zhang Yanfei, "Internal Combustion Engine and Accessories", China Academic Journal Electronic Publishing House, vol. 2018, No. 7, Published Apr. 15, 2018, 3 pages.

\* cited by examiner

SYSTEMS FOR COUPLING DECODERS TO QUANTUM REGISTERS

CROSS REFERENCE TO RELATED APPLICATIONS

This application claims priority to U.S. Provisional Patent Application Ser. No. 62/883,514, filed Aug. 6, 2019, the entirety of which is hereby incorporated herein by reference for all purposes.

BACKGROUND

The scalability of decoders for quantum error correction is an ongoing challenge in generating practical quantum computing devices. Most current work on error decoders focuses on time complexity and the error correction capability of the decoding algorithm. Practically, providing one or more dedicated decoders for each logical qubit of a quantum computer significantly limits the size and scale of such devices.

SUMMARY

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. Furthermore, the claimed subject matter is not limited to implementations that solve any or all disadvantages noted in any part of this disclosure.

A quantum computing device comprises at least one quantum register including l logical qubits, where l is a positive integer. The quantum computing device further includes a set of d decoder blocks coupled to the at least one quantum register, where d<2*l. In this way, the decoder blocks may share decoding requests generated by the logical qubits.

DETAILED DESCRIPTION

Figure 1:
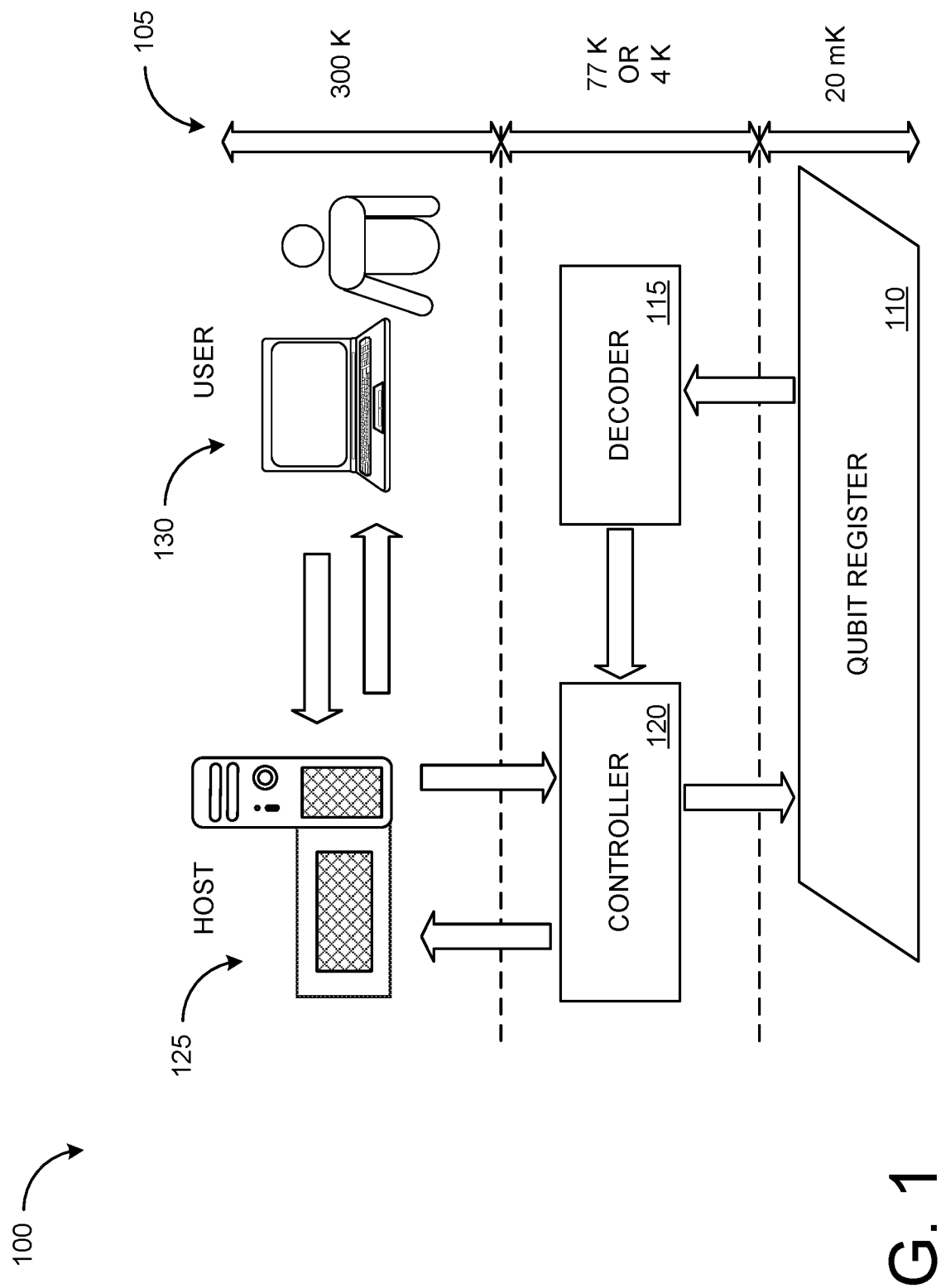
FIG. 1 schematically shows an example quantum computing organization.

Qubits, the fundamental units of information in quantum computers, are prone to high error rates. To enable fault tolerant quantum computation, active error correction may be applied to these qubits. Quantum Error Correction Codes (QECC) encode logical qubits using redundant data and parity qubits. Error correction diagnoses the errors on data qubits by analyzing the measurements of the parity qubits through a process called error decoding. At present, most decoding approaches target qubit error at the algorithmic level and do not account for the underlying device technology that will be used to design them.

Herein, architectural challenges involved in designing these decoders are targeted, and a 3-stage pipelined micro-architecture for a hardware implementation of the Union-Find decoder is described. The error correction algorithms are designed to fit the hardware implementation. The feasibility of data compression for different noise regimes is evaluated with regard to the amount of storage and bandwidth required for implementation. An architecture that scales the proposed decoder design for a large number of logical qubits and enables practical, fault-tolerant quantum computation is disclosed. Such a design may reduce the total cost of each of the three pipeline stages by 2×, 4×, and 4×, respectively, through resource sharing across multiple logical qubits without impacting the decoder correctness and error threshold. As one example, for a code distance of 11 and a physical error rate on the order of $10^{-3}$, the logical error rate is $10^{-8}$.

Quantum computing uses quantum mechanical properties to enable computations for specific applications that would otherwise not be feasible to perform in a reasonable amount of time on conventional (i.e., nonquantum), state-of-the-art computers. Example applications include prime factorization, database search, physics and chemistry simulations. The fundamental unit of computation on a quantum computer is a qubit. Qubits inevitably interact with the environment and lose their quantum state. Imperfect quantum gate operations compound this problem, since quantum gates are unitary transformations chosen from a continuum of possible values and thus cannot be implemented with perfect accuracy. To protect quantum states from noise, QECCs have been developed. In any QECC, logical qubits are encoded using several physical qubits to enable fault tolerant quantum computations. Fault tolerance incurs resource overheads (typically 20×-100× per logical qubit) and is not practically feasible on the small prototype machines currently available. However, Quantum Error Correction is believed to be very valuable, if not outright necessary, in order to run useful applications on fault-tolerant quantum computers.

QECCs differ from classical error correction techniques like Triple Modular Redundancy (TMR) or Single Error Correction Double Error Detection (SECDED). The differences arise from the fundamental properties and high error rates of qubits (typically in the order of $10^{-2}$). For example, qubits cannot be copied (no-cloning theorem) and lose their quantum state when measured. QECCs use redundant qubits to create a code space by using ancilla qubits that interact with data qubits. By measuring the ancilla qubits, it is possible to detect and correct errors on the data qubits using a decoder.

The error decoding algorithm specifies how a syndrome (the outcome of ancilla measurements) will be processed to detect errors in an encoded block of data qubits. The design and performance of a decoder depends on the decoding algorithm, QECC, physical error rate, noise model, and implementation technology. For practical purposes, decoders must process syndrome measurements faster than the rate at which errors occur. They must also account for the technology specific constraints for operation inside a cryogenic environment and scale to a large number of qubits.

Perfect error decoding is NP-hard (non-deterministic polynomial-time) with exponential time complexity. Therefore, optimal decoding algorithms trade-off error correction capability to reduce time complexity. Most decoding techniques have only been studied at the algorithmic level and do not account for the underlying implementation technology, even though decoders are seminal to fault tolerant quantum computing. Other approaches, such as look-up table based or deep neural decoders are not scalable to a large number of qubits. The Union-Find decoder algorithm is simple and has nearly linear time complexity, making it a suitable candidate for scalable, fault-tolerant quantum computing. Herein, a micro-architecture for a hardware implementation of the Union-Find decoder is disclosed, wherein the algorithm is redesigned to reduce the hardware complexity, and to allow scaling to a large number of logical qubits.

To enable faster processing and to reduce transport latencies decoders are designed to operate very close to the physical qubits (at 77 K or 4 K) as opposed to room temperature (300 K). An example quantum computing system 100 indicating a temperature gradient 105 is shown in FIG. 1. Quantum computing system 100 includes one or more qubit registers 110 operating at 20 mK, a decoder 115 and controller 120, typically operating at either 4 K or 77 K, and a host computing device 125 and an end user computing device 130 operating at 300 K (room temperature). Depending upon whether decoder 115 operates at 77 K or 4 K, the underlying implementation technology and design constraints offer different trade-offs. Superconducting logic designs at 4 K offer close proximity to the physical qubits and significant energy-efficiency, but are limited by device densities and memory capacities. Operating a conventional CMOS at 77 K can facilitate complex designs for applications with larger memory footprint, but it is less energy-efficient than superconducting logic and incurs data transmission overheads in moving data back and forth from the physical qubits resident at 15-20 mK.

Herein, a micro-architecture for a hardware implementation of the Union-Find decoder is disclosed. The implementation challenges associated with memory capacity and bandwidth for operation in a cryogenic environment are discussed. Surface code is used as an example for the underlying QECC and various noise models, though other implementations have been considered. Surface code is a promising QECC candidate that arranges a group of qubits in a 2-dimensional layout with alternating data and ancilla qubits. Any error in a data qubit may be detected by its adjacent ancilla qubits, thereby requiring only nearest neighbor connectivity. The feasibility and scalability of such a design is described for large scale fault-tolerant quantum computers.

Herein, systems and methods are disclosed that solve numerous problems in the field of quantum computing. For example, QEC decoder design is analyzed, with their placement in the thermal domain and design complexity involved. A micro-architecture for a hardware implementation of the Union-Find decoder is presented which demonstrates that it is more practical to operate the decoder at 77 K.

The memory capacity required to store syndrome measurement is computed, and shown that it may not be feasible to store them in superconducting memories at 4 K. However, transporting the data to 77 K requires large bandwidth. To overcome both of these challenges, techniques are presented that can be used to compress the syndrome measurement data. Implementations of dynamic zero compression and sparse representation are described. In addition, a geometry-based compression scheme is presented that takes into account the underlying structure of the surface code lattice. Additionally, compression schemes and their applicability are described for different noise regimes.

The Union-Find decoder algorithm is refined in order to reduce hardware costs and for improved implementation in enhanced noise models. The original Union-Find decoding algorithm only accounts for gate errors on data qubits that pair in space. The hardware micro-architecture described herein also accounts for measurement errors that pair in time and are decoded using several rounds of syndrome measurements.

Additionally, a hardware system architecture is described that scales these decoders for a large number of logical qubits. Such an implementation may take into account the difference in utilization of the pipeline stages in individual decoding units and enables optimal sharing of resources across multiple logical qubits to reduce the hardware cost.

A qubit is the basic unit of information on a quantum computer. The fundamentals of quantum computing rely on two quantum mechanical properties: superposition and entanglement. A qubit may be represented as a linear combination of its two basis states. If the basis states are $|0\rangle$ and $|1\rangle$, a qubit $|\psi\rangle$ can be represented as $|\psi\rangle = \alpha|0\rangle + \beta|1\rangle$, where $\alpha, \beta \in \mathbb{C}$ and $|\alpha|^2 + |\beta|^2 = 1$. The state of a qubit changes when the magnitude or/and phase of the probability amplitudes $\alpha, \beta$ change. For example, a magnitude flip (or bit-flip) changes the state of $|\psi\rangle$ to $\beta|0\rangle + \alpha|1\rangle$. Alternately, a phase-flip changes its state to $\alpha|0\rangle - \beta|1\rangle$. Quantum instructions modify the probability amplitudes using quantum gate operations that are represented using identity (I) and Pauli matrices. Pauli matrices X, Z, and Y denote the effects of bit-flip, phase-flip, or both respectively.

Figure 2:
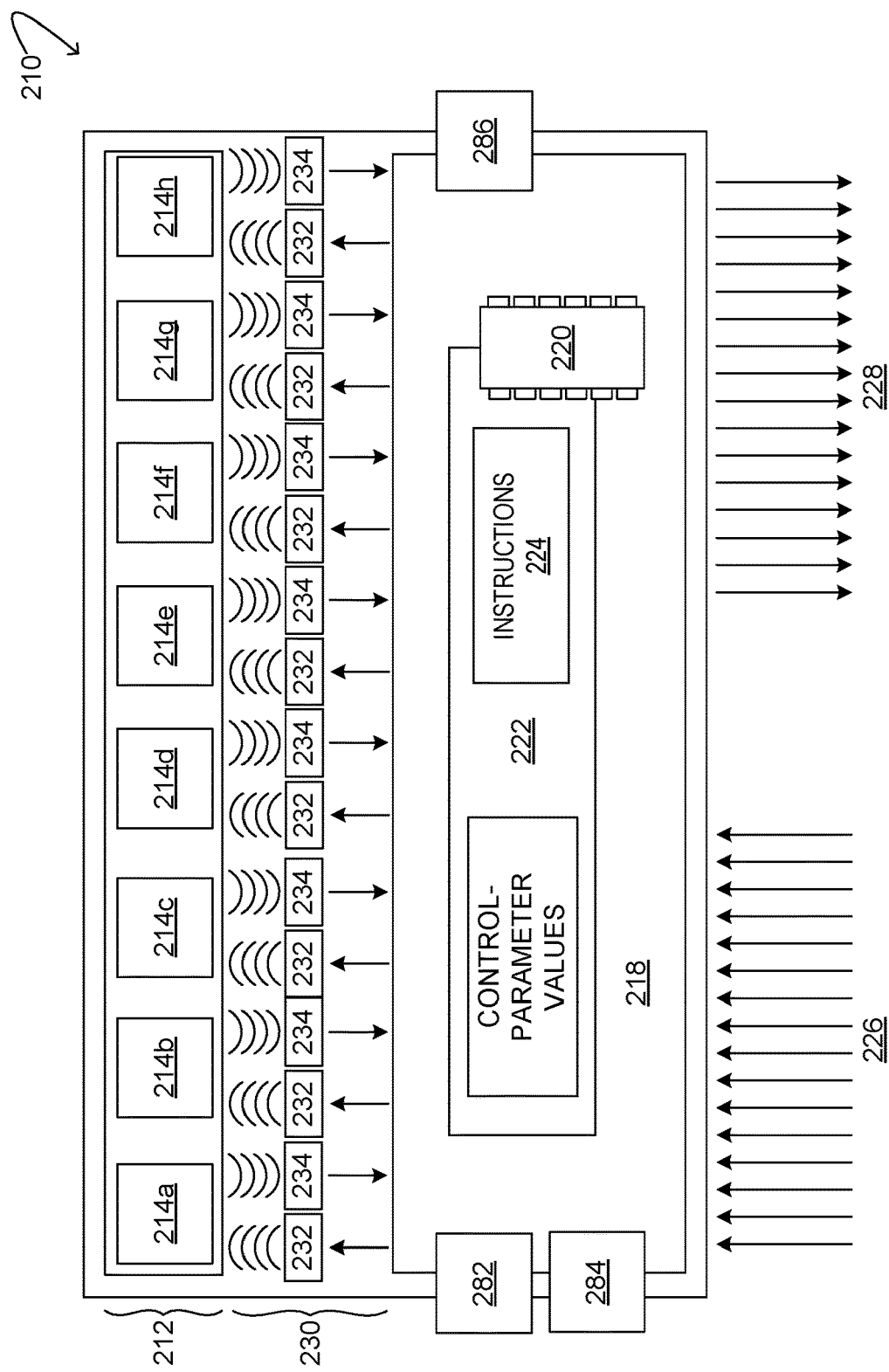
FIG. 2 schematically shows aspects of an example quantum computer.

In some embodiments, the methods and processes described herein may be tied to a quantum computing system of one or more quantum computing devices. FIG. 2 shows aspects of an example quantum computer 210 configured to execute quantum-logic operations (vide infra). Whereas conventional computer memory holds digital data in an array of bits and enacts bit-wise logical operations, a quantum computer holds data in an array of qubits and operates quantum-mechanically on the qubits in order to implement the desired logic. Accordingly, quantum computer 210 of FIG. 2 includes at least one register 212 comprising an array of qubits 214. The illustrated register is eight qubits in length; registers comprising longer and shorter qubit arrays are also envisaged, as are quantum computers comprising two or more registers of any length.

The qubits of register 212 may take various forms, depending on the desired architecture of quantum computer 210. Each qubit 214 may comprise: a superconducting Josephson junction, a trapped ion, a trapped atom coupled to a high-finesse cavity, an atom or molecule confined within a fullerene, an ion or neutral dopant atom confined within a host lattice, a quantum dot exhibiting discrete spatial- or spin-electronic states, electron holes in semiconductor junctions entrained via an electrostatic trap, a coupled quantum-wire pair, an atomic nucleus addressable by magnetic resonance, a free electron in helium, a molecular magnet, or a metal-like carbon nanosphere, as nonlimiting examples. More generally, each qubit 214 may comprise any particle or system of particles that can exist in two or more discrete quantum states that can be measured and manipulated experimentally. For instance, a qubit may also be implemented in the plural processing states corresponding to different modes of light propagation through linear optical elements (e.g., mirrors, beam splitters and phase shifters), as well as in states accumulated within a Bose-Einstein condensate.

Figure 3:
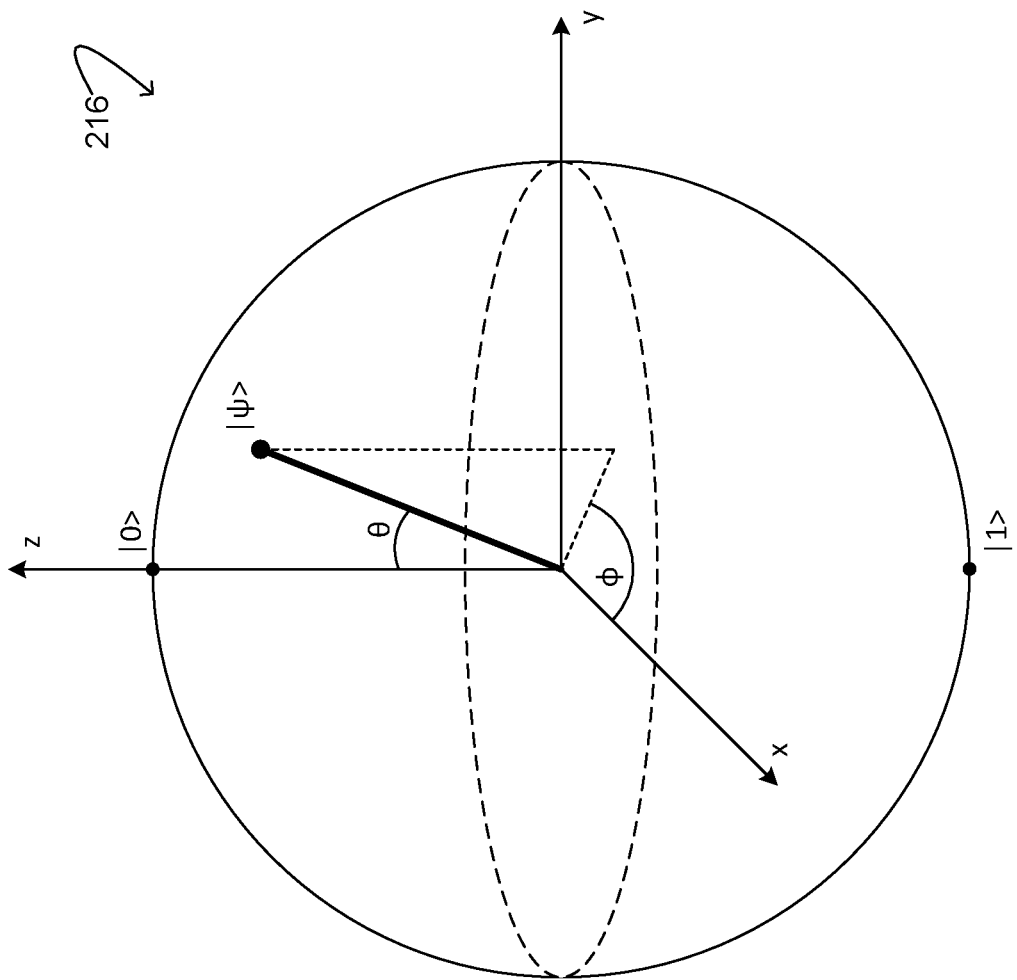
FIG. 3 illustrates a Bloch sphere, which graphically represents the quantum state of one qubit of a quantum computer.

FIG. 3 is an illustration of a Bloch sphere 216, which provides a graphical description of some quantum mechanical aspects of an individual qubit 214. In this description, the north and south poles of the Bloch sphere correspond to the standard basis vectors $|0\rangle$ and $|1\rangle$, respectively—up and down spin states, for example, of an electron or other fermion. The set of points on the surface of the Bloch sphere comprise all possible pure states $|\psi\rangle$ of the qubit, while the interior points correspond to all possible mixed states. A mixed state of a given qubit may result from decoherence which may occur because of undesirable couplings to external degrees of freedom.

Returning now to FIG. 2, quantum computer 210 includes a controller 218. The controller may comprise conventional electronic componentry, including at least one processor 220 and associated storage machine 222. The term 'conventional' is applied herein to any component that can be modeled as an ensemble of particles without considering the quantum state of any individual particle. Conventional electronic components include integrated, microlithographed transistors, resistors, and capacitors, for example. Storage machine 222 may be configured to hold program instructions 224 that cause processor 220 to execute any process described herein. Additional aspects of controller 218 are described hereinafter.

Controller 218 of quantum computer 210 is configured to receive a plurality of inputs 226 and to provide a plurality of outputs 228. The inputs and outputs may each comprise digital and/or analog lines. At least some of the inputs and outputs may be data lines through which data is provided to and extracted from the quantum computer. Other inputs may comprise control lines via which the operation of the quantum computer may be adjusted or otherwise controlled.

Controller 218 is operatively coupled to register 212 via interface 230. The interface is configured to exchange data bidirectionally with the controller. The interface is further configured to exchange signal corresponding to the data bidirectionally with the register. Depending on the architecture of quantum computer 210, such signal may include electrical, magnetic, and/or optical signal. Via signal conveyed through the interface, the controller may interrogate and otherwise influence the quantum state held in the register, as defined by the collective quantum state of the array of qubits 214. To this end, the interface includes at least one modulator 232 and at least one demodulator 234, each coupled operatively to one or more qubits of register 212. Each modulator is configured to output a signal to the register based on modulation data received from the controller. Each demodulator is configured to sense a signal from the register and to output data to the controller based on the signal. The data received from the demodulator may, in some scenarios, be an estimate of an observable to the measurement of the quantum state held in the register.

More specifically, suitably configured signal from modulator 232 may interact physically with one or more qubits 214 of register 212 to trigger measurement of the quantum state held in one or more qubits. Demodulator 234 may then sense a resulting signal released by the one or more qubits pursuant to the measurement, and may furnish the data corresponding to the resulting signal to the controller. Stated another way, the demodulator may be configured to reveal, based on the signal received, an estimate of an observables reflecting the quantum state of one or more qubits of the register, and to furnish the estimate to controller 218. In one non-limiting example, the modulator may provide, based on data from the controller, an appropriate voltage pulse or pulse train to an electrode of one or more qubits, to initiate a measurement. In short order, the demodulator may sense photon emission from the one or more qubits and may assert a corresponding digital voltage level on an interface line into the controller. Generally speaking, any measurement of a quantum-mechanical state is defined by the operator $\hat{O}$ corresponding to the observable to be measured; the result R of the measurement is guaranteed to be one of the allowed eigenvalues of $\hat{O}$. In quantum computer 210, R is statistically related to the register state prior to the measurement, but is not uniquely determined by the register state.

Pursuant to appropriate input from controller 218, interface 230 may be further configured to implement one or more quantum-logic gates to operate on the quantum state held in register 212. Whereas the function of each type of logic gate of a conventional computer system is described according to a corresponding truth table, the function of each type of quantum gate is described by a corresponding operator matrix. The operator matrix operates on (i.e., multiplies) the complex vector representing the register state and effects a specified rotation of that vector in Hilbert space.

Continuing in FIG. 2, suitably configured signal from modulators 232 of interface 230 may interact physically with one or more qubits 214 of register 212 so as to assert any desired quantum-gate operation. As noted above, the desired quantum-gate operations are specifically defined rotations of a complex vector representing the register state. In order to effect a desired rotation O^, one or more modulators of interface 230 may apply a predetermined signal level $S_i$ for a predetermined duration $T_i$.

In some examples, plural signal levels may be applied for plural sequences or otherwise associated durations. In a more particular example, the plural signal levels and durations are arranged to form a composite signal waveform, which may be applied to one or more qubits of the register. In general, each signal level $S_i$ and each duration $T_i$ is a control parameter adjustable by appropriate programming of controller 218. In other quantum-computing architectures, different sets of adjustable control parameters may control the quantum operation applied to the register state.

Qubits inevitably lose their quantum state through their interactions with different degrees of freedom in their surroundings. Even if qubits could be perfectly isolated from environmental noise, quantum gate operations are imperfect and cannot be applied with precise accuracy. This poses various limitations in running any application on a quantum computer. Thus, the quantum states manipulated by a quantum computer must undergo error correction using Quantum Error Correction Codes (QECCs). A QECC encodes a logical qubit into a collection of physical qubits such that the error rate of the logical qubit is lower than the physical error rate. QECC enables fault tolerant quantum computations as long as the physical error rate is below an acceptable threshold at the expense of an increased number of physical qubits. In recent years, several error correction protocols have been proposed. Herein, surface code is applied, which is considered the most promising QECC for fault tolerant quantum computing. QEC models any arbitrary noise as a superposition of quantum operations. Thus, QECCs capture the effect of errors as a bitflip, phase flip, or a combination of both using Pauli matrices.

Surface code is widely considered suitable for scalable fault tolerant quantum computing. It encodes a logical qubit in a lattice with alternating data and parity qubits. A schematic representation of such a lattice is shown at 400 of FIG. 4, lattice 400 having a 2D distance-3 (d=3) surface-code. Each X stabilizer 402 and Y stabilizer 404 is coupled to its adjacent data qubits 406. Each data qubit 406 only interacts with its nearest neighboring parity qubits 408, and thus by measuring the locally supported operators, errors on the data qubits 406 can be diagnosed as shown at 410. In this example, a Z-error 412 on data qubit A 414 is captured by parity qubits P0 416 and P1 418. Similarly, an X-error 420 on data qubit B 422 is captured by parity qubits P2 424 and P3 426. In the simplest realization, a surface code of distance d uses $(2d-1)^2$ physical qubits to store a single logical qubit, where d is a measure of redundancy and error tolerance. A larger code distance results in greater redundancy and increased error tolerance.

Figure 4:
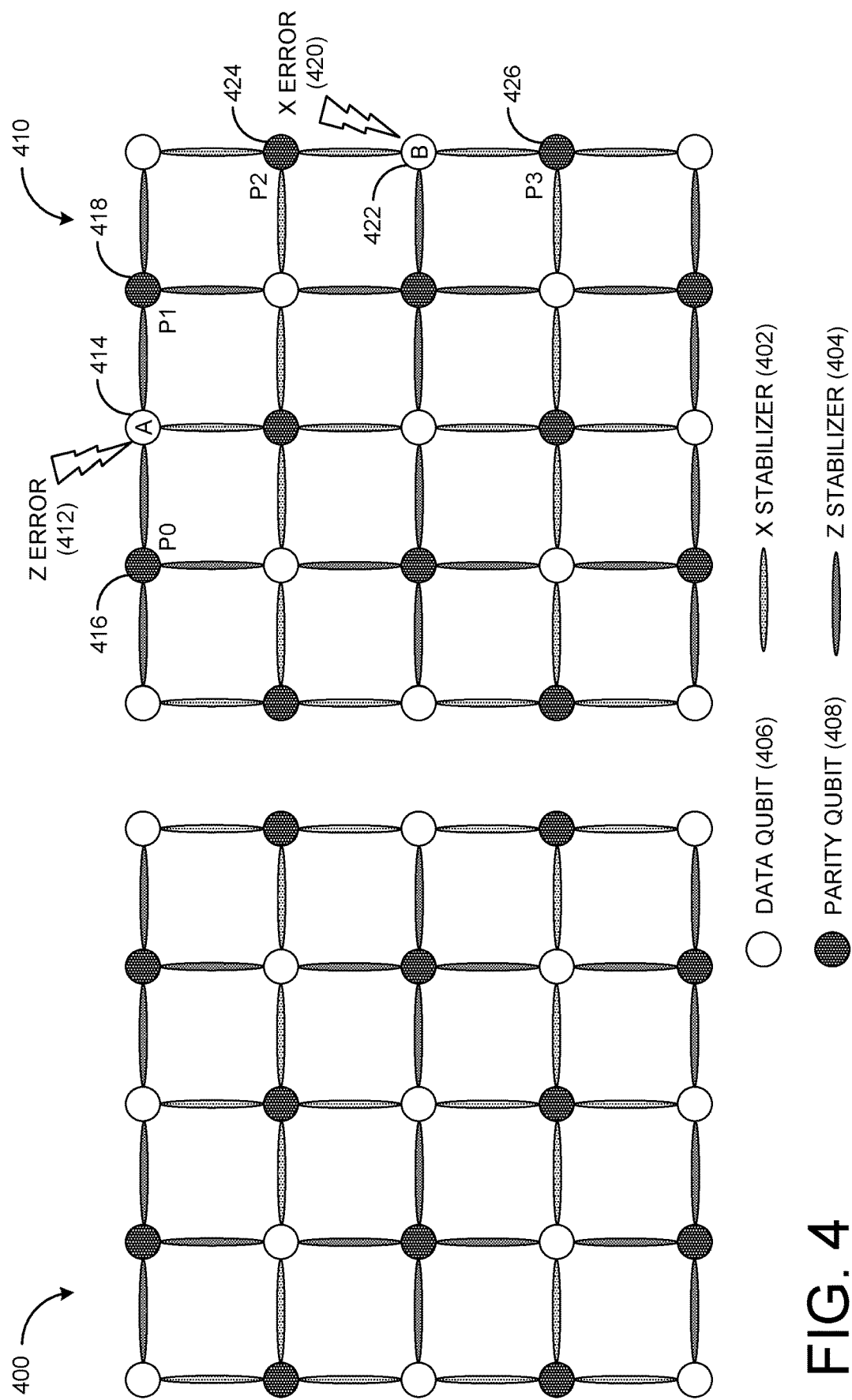
FIG. 4 schematically shows a logical qubit in a lattice with alternating data and parity qubits.

The logical operators include a string of single qubit operators between two opposite edges. The code space is the subspace for which all stabilizer generators (as shown in FIG. 4) have +1 eigenvalue. By construction, logical states are invariant under the application of a stabilizer generator. The application of any closed loop of Pauli operators will leave the logical state invariant. The measurement of the stabilizer generators detects the endpoints of a chain of errors. Error correction is based on this information and the stabilizer measurement is referred to as a syndrome.

In QEC, the effect of an error is reversed by applying the appropriate Pauli gate. For example, if a qubit encounters a bit-flip error, applying the Pauli X gate flips it back to the intended state. It has been shown previously that as long as Clifford gates are applied on qubits, there is no need to perform active error correction. Instead, keeping track of Pauli frames in software is sufficient. Thus, the primary focus of quantum error correction is error decoding, rather than error correction. Optimal error decoding is a computationally hard problem. Quantum error decoders take a syndrome measurement as input and return an estimation of the error in the data qubits. Besides their ability to detect errors, decoders rely on a high operational speed to prevent accumulation of errors. In other words, errors must be detected faster than they occur.

Since error decoding must be fast, decoders must offer high performance and operate close to the physical qubits. As described with regard to FIG. 1, qubits are typically operated at 15-20 milliKelvins. Depending upon whether a decoder is designed for operation at 4 K or 77 K, the implementation technologies offer different trade-offs as specified in Table 1. Hardware designed to operate at 4 K must meet stringent power requirements owing to the proximity to the physical qubits. This is to ensure the thermal noise stays under control. Additionally, these designs must be cooled using sophisticated and expensive liquid Helium coolers. Decoders may be designed using either CMOS or superconducting logic at 4 K. CMOS has power dissipation and therefore cannot be used in large scale quantum computers. Superconducting logic offer low power consumption but suffers from major drawbacks such as limited device densities and low memory capacities, making it extremely difficult to fabricate complex and large designs. Traditional CMOS operating at 77 K offers the capability to design complex systems with larger memory and power budgets. The cooling overheads associated with 77 K is an order of magnitude lower than for 4 K. However, a decoder designed to operate at 77 K must account for the transport latencies and meet the bandwidth required in transferring data back and forth between 4 K and 77 K. The trade-offs between superconducting technology at 4 K and CMOS at 77 K are listed in Table 1.

TABLE 1

| Parameter | Superconducting Technology | Traditional CMOS |
|---|---|---|
| Operating Temperature | 4 K | 77 K |
| Operating Frequency | 10 GHz | 4 GHz |
| Memory Capacity | 123-512 Bytes | 4 Gb |
| Power Budget | 1 W | N/A |
| Feature Size | 248 nm | 7-16 nm |
| Cooling Overheads | 1000x/400x | 10x |

Herein, the challenges in designing the micro-architecture of a decoder for quantum error correction under realistic noise models are examined. Qubit errors can be broadly classified into three types: decoherence errors, gate errors, and measurement errors. Qubits retain their quantum state only for short duration of time (referred to as the decoherence time) leading to decoherence errors. Non-ideal gate operations lead to gate errors on qubits. Imperfections in qubit measurements lead to measurement errors. A decoder may misinterpret a syndrome measurement error as a data qubit error and correct a non-erroneous data qubit, thereby introducing an error. A decoder must take into account such syndrome measurement errors while decoding errors. This directly impacts the micro-architecture and design choices of the decoder.

Figure 5:
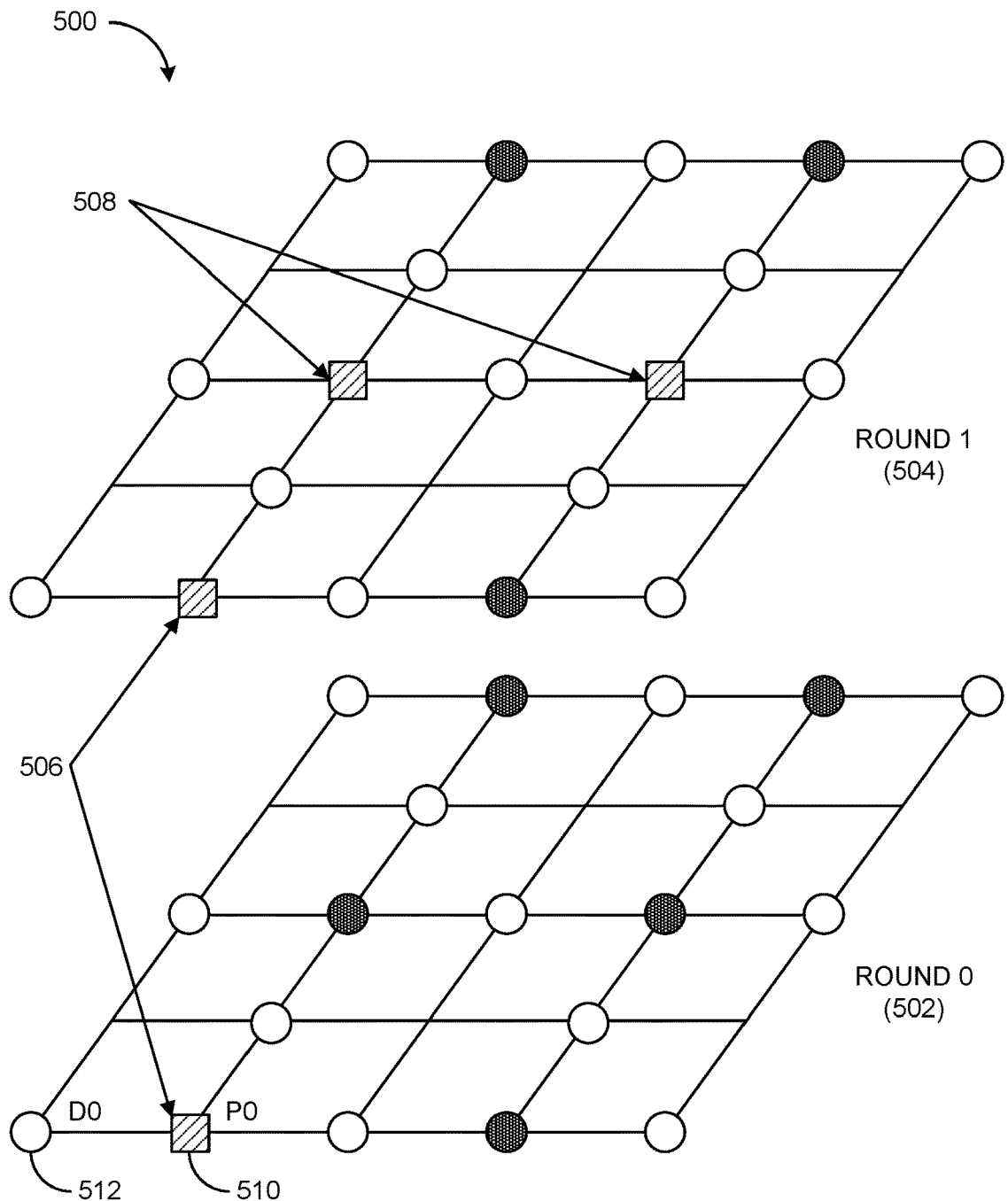
FIG. 5 schematically shows two consecutive rounds of syndrome measurements.

FIG. 5 shows a diagram 500, indicating two consecutive rounds of syndrome measurements 502 and 504, and showing how measurement errors 506 pair in time and data qubit errors 508 pair in space. Diagram 500 shows that if the decoder only examines the measurement outcomes of Round 0 502, it will misinterpret the error on parity qubit P0 510 and force a correction for D0 512 which is error-free. Current decoders tackle syndrome measurement errors by examining d rounds of measurements where d is the code distance. The data generated by d rounds of syndrome measurements and an error log per data qubit must be stored for a decoder to function correctly. This requires up to several megabytes of storage (depending on the code distance and number of logical qubits).

Figure 6:
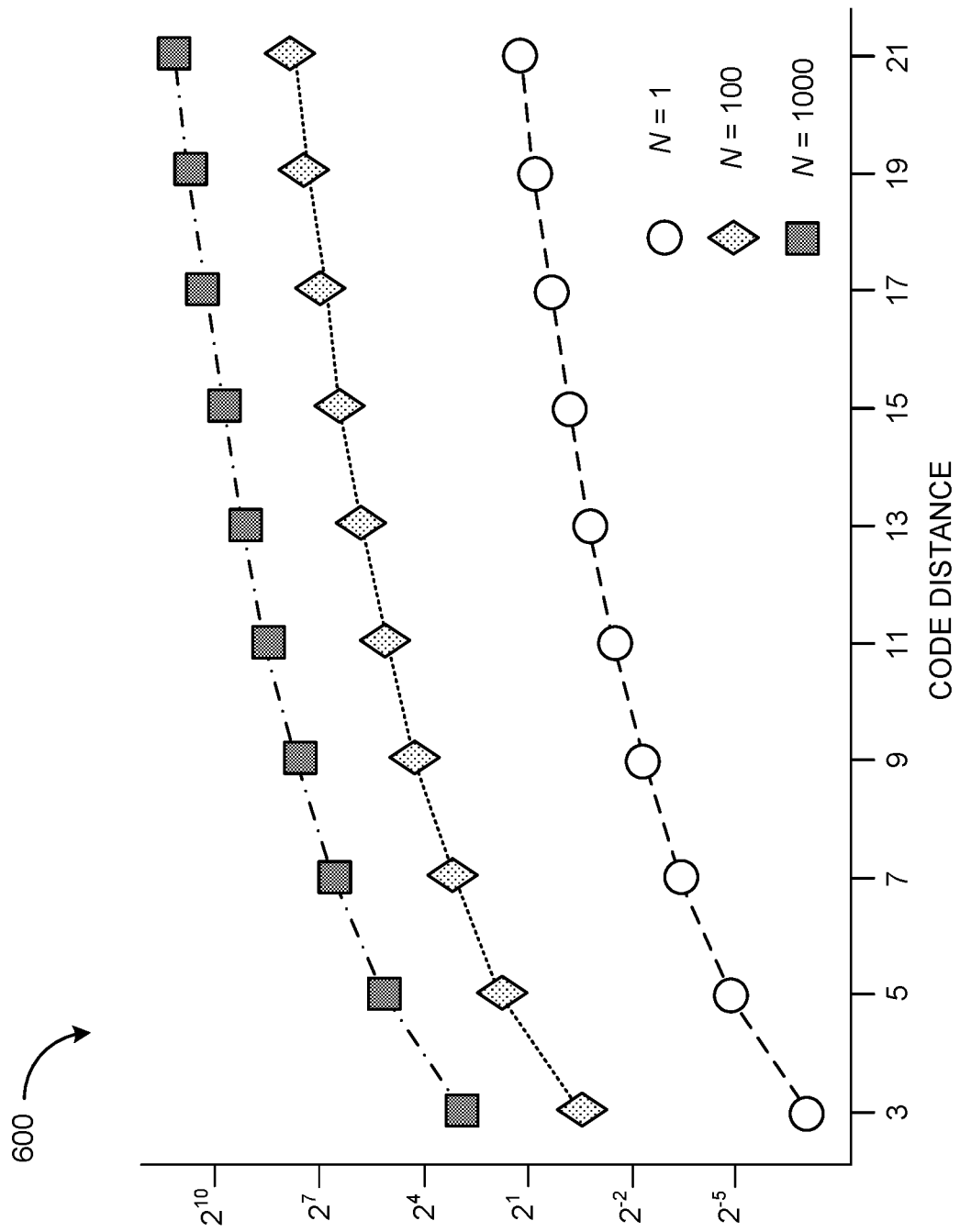
FIG. 6 is a plot indicating memory capacity required to store syndrome measurement data under varying conditions.

FIG. 6 shows an example plot 600 indicating memory capacity (in KBs) required to store syndrome measurement data for d (code distance) rounds and error log for N logical qubits. The required capacity is much higher than available memory in superconducting logic at 4 K. In order to perform error decoding at 77 K, the measurement data must be transported from 4 K to 77 K. For a given qubit plane with L logical qubits and each qubit encoded using a surface code of distance d 2d(d−1)L bits must be sent at the end of each syndrome measurement cycle. Assuming a reasonable number of logical qubits and code distance, the 4 K-77 K links require bandwidth ranging in the order of several Gb/s. Data transmission at a lower bandwidth reduces the effective time left for error decoding since it must provide an estimation of the error within d syndrome measurement cycles (e.g., surface code cycles may be broken down in to d syndrome measurement cycles). Thus, a major challenge in designing any decoder at 77 K is the very large bandwidth required.

One approach to efficiently deal with capacity and bandwidth requirements in caches and main memory is data compression. The sparsity of the measurement data may be analyzed and estimated analytically as described herein. For example, let p be the probability of a Z-error on a data qubit and let u be the indicator vector of errors for 11 data qubits (Note that the same analysis holds true for X syndromes). If there are 4 data qubits and the first two have Z errors, then u=1100. Assuming an identical and independent distribution (iid) of errors, the upper bound on the Hamming weight of a syndrome is given by Equation (1), where |u| is the Hamming weight (e.g., number of 1s) of the error indicator vector u.

$$\mathbb{P}(Z^u) = p^{|u|}(1-p)^{n-|u|} \quad (Eq\ 1)$$

Thus, the probability that there are m or more errors is given by Equation 2:

$$\mathbb{P}(Z^u \text{ with } |u| \geq m) = C_m^n p^m \quad (Eq\ 2)$$

Using union-bound, the upper bound of the total number of syndrome bits $s(Z^u)$ is given by Equation 3.

$$s(Z^u) \leq 2|u| \quad (Eq\ 3)$$

Assuming a code distance of 11 and an error rate of $10^{-3}$, the probability of having 10 or more errors (a reasonably large number of errors for the given code distance) is $6.2 \times 10^{-14}$. Thus, the probability to observe a syndrome with a large Hamming weight is extremely low. This analysis shows it is possible to compress syndrome data to reduce storage overheads of storage and/or meet the bandwidth requirements. Different compression techniques for syndrome data are described herein, as the usefulness of a compression technique depends on the entropy of data. Herein, three compression techniques are described, though others have been considered. The different noise regimes they can be applied to are analyzed. The described examples each feature compression schemes that use simple encoding and do not require large hardware complexity.

Figure 7:
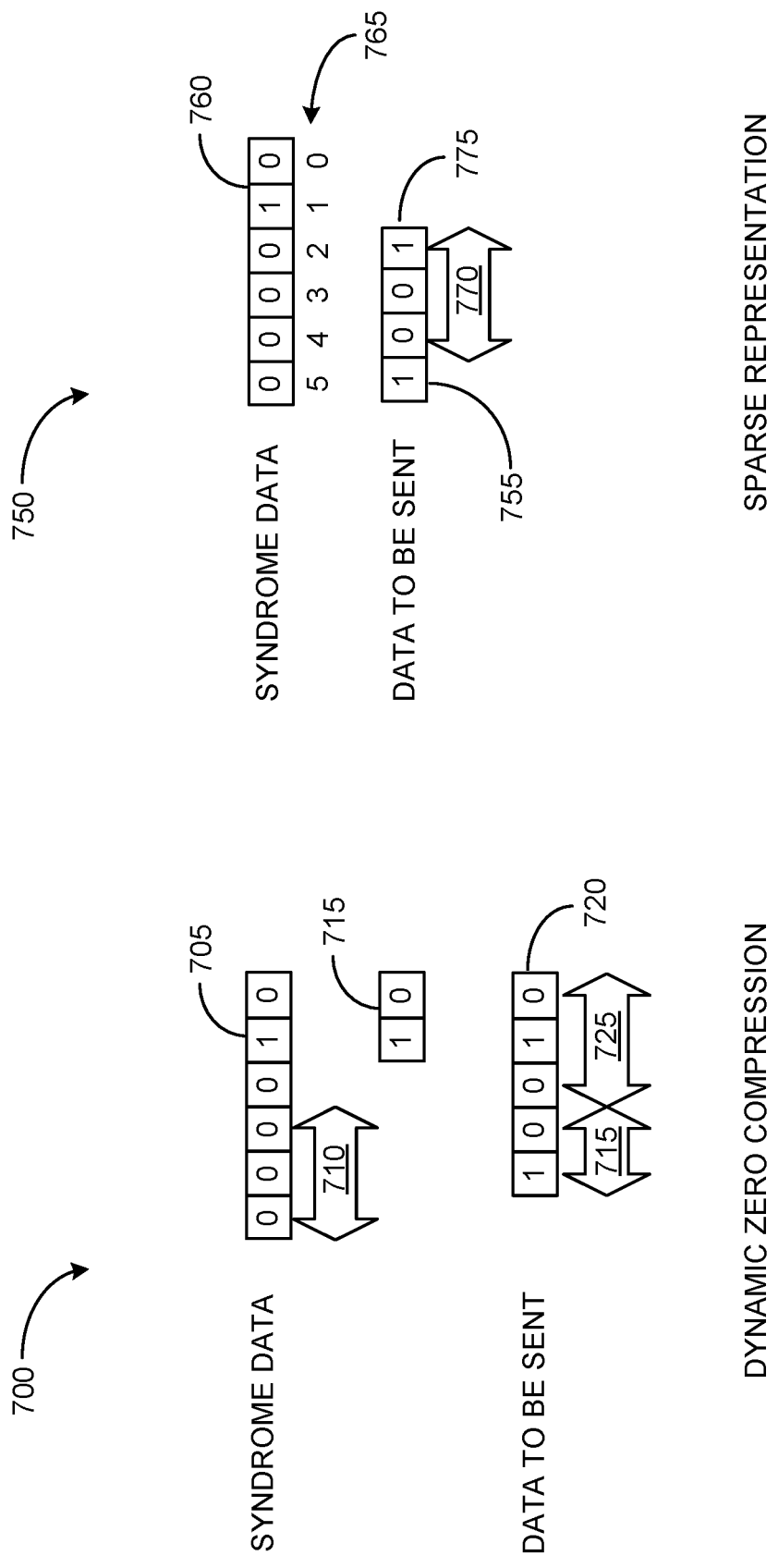
FIG. 7 schematically shows example compression schemes.

Dynamic Zero Compression (DZC) was originally introduced to reduce energy required for cache accesses of zero-valued bytes. A similar technique may be adopted to compress syndrome data. One example is shown at 700 of FIG. 7. A syndrome 705 of length L is grouped into K blocks of W bits each, where W is the compression width 710. Extra padding zeros may be added if the last block has less than W bits. A K-bit wide Zero Indicator Bit (ZIB) vector 715 includes 1 bit per block. If all the bits of the $i^{th}$ block are 0s, the corresponding bit in the ZIB (ZIB[i]) may be set to 1. Otherwise, the bit may be set to 0. The data to be transmitted 720 may be obtained by appending the non-zero blocks 725 at the end of the ZIB vector.

Sparse Representation, as shown at 750, may be considered similar to the traditional technique of storing sparse matrices where the non-zero elements of a sparse matrix 760 are stored by only storing the row and column indices 765. A Sparse Representation Bit (SRB) 755 is used to indicate if all the syndrome bits are zero. If there are one or more non-zero bit in the syndrome, the SRB may be unset and the indices 755 of the non-zero elements may be sent alongside the SRB in the transmitted data 775.

Figure 8:
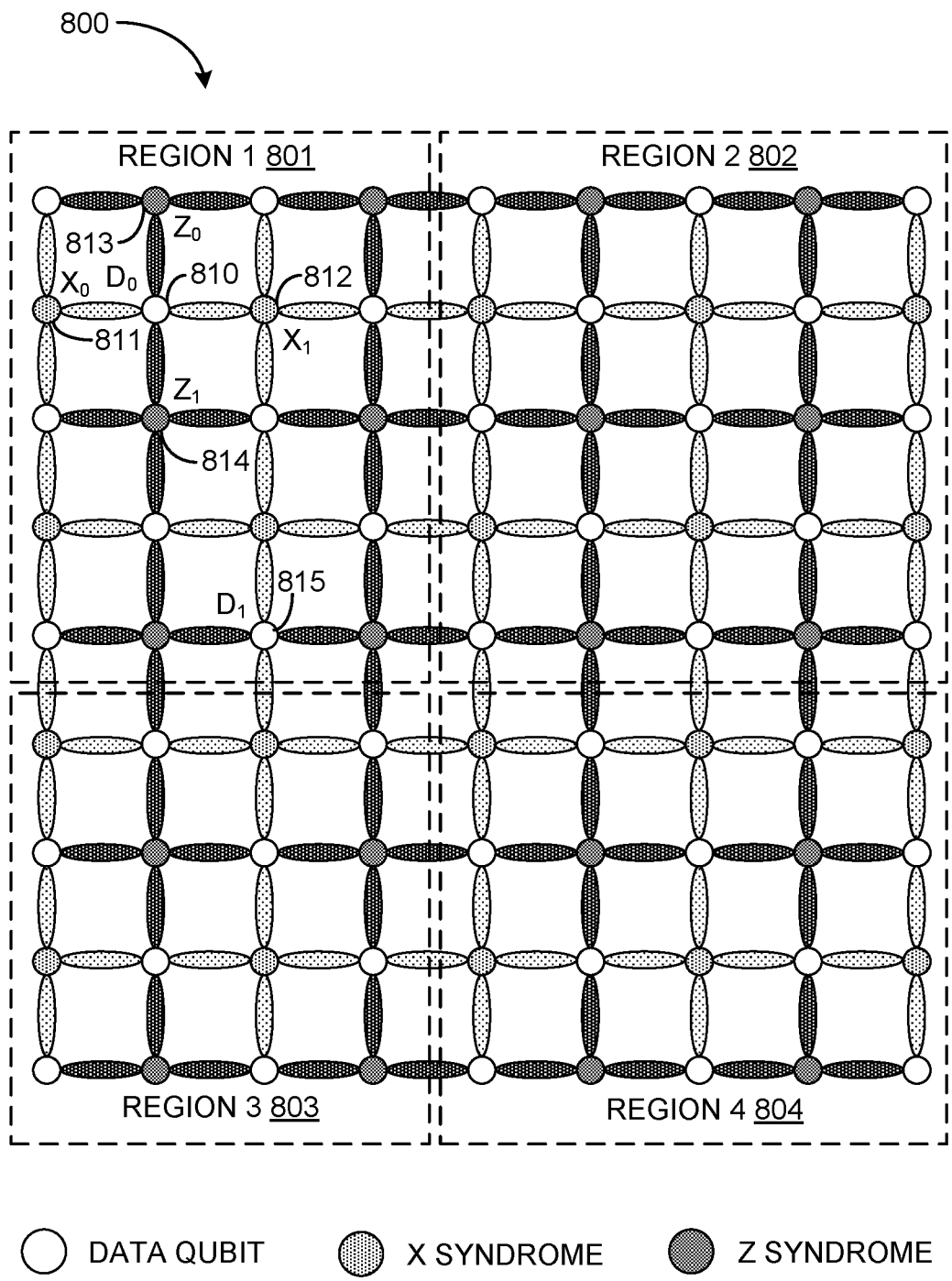
FIG. 8 schematically shows a plurality of regions on a surface code lattice for Geometry-based compression.

Geometry-based compression (Geo-Comp) may be considered an adaptation of DZC that also accounts for the geometry of the surface code lattice. Rather than compressing X and Z syndromes separately, a geometry-based compression scheme may compress regions of X and Z syndromes together. The entire surface code lattice may be partitioned into multiple regions with each region roughly containing an equal number of syndrome bits (similar to compression width in DZC). FIG. 8 schematically shows a surface code lattice 800 including multiple regions (801, 802, 803, 804; indicated by dotted lines) for Geometry-based compression. FIG. 8 shows one example of how a surface code lattice of distance 5 may be partitioned in to 4 regions. Using a ZIB for each region and transmitting only syndrome data from the non-zero regions, the syndromes may be compressed. When a Y error occurs on a data qubit, both X and Z syndrome bits flip to indicate the error. When the two types of syndromes are compressed independently, the total number of non-zero blocks is higher for a given compression width. For example, if the data qubit D0 810 shown in FIG. 8 encounters an Y error, X syndrome bits X0 811 and X1 812 and Z syndrome bits Z0 813 and Z1 814 flip. In compression schemes such as DZC, (X0 811, X1 812) and (Z0 813, Z1 814) lie on different data blocks and are compressed separately. However, if the geometry of the lattice is taken into account, the non-zero syndrome bits typically lie inside the same region unless the data qubit is on the region boundary (for example, D1 815 in lattice 800).

In general, the number and size of the regions may be adjusted for a given noise model by computing the expected number of blocks that contains trivial syndromes (all zeros). However, larger sized regions lead to complex hardware by adding to the logic depth. Thus, small region sizes (depending on the code distance) may be analyzed even for very low error rates. Regions need not be equal in size, and the size and/or number of regions may be determined based on an expected number of data blocks that contain trivial syndromes.

Figure 9:
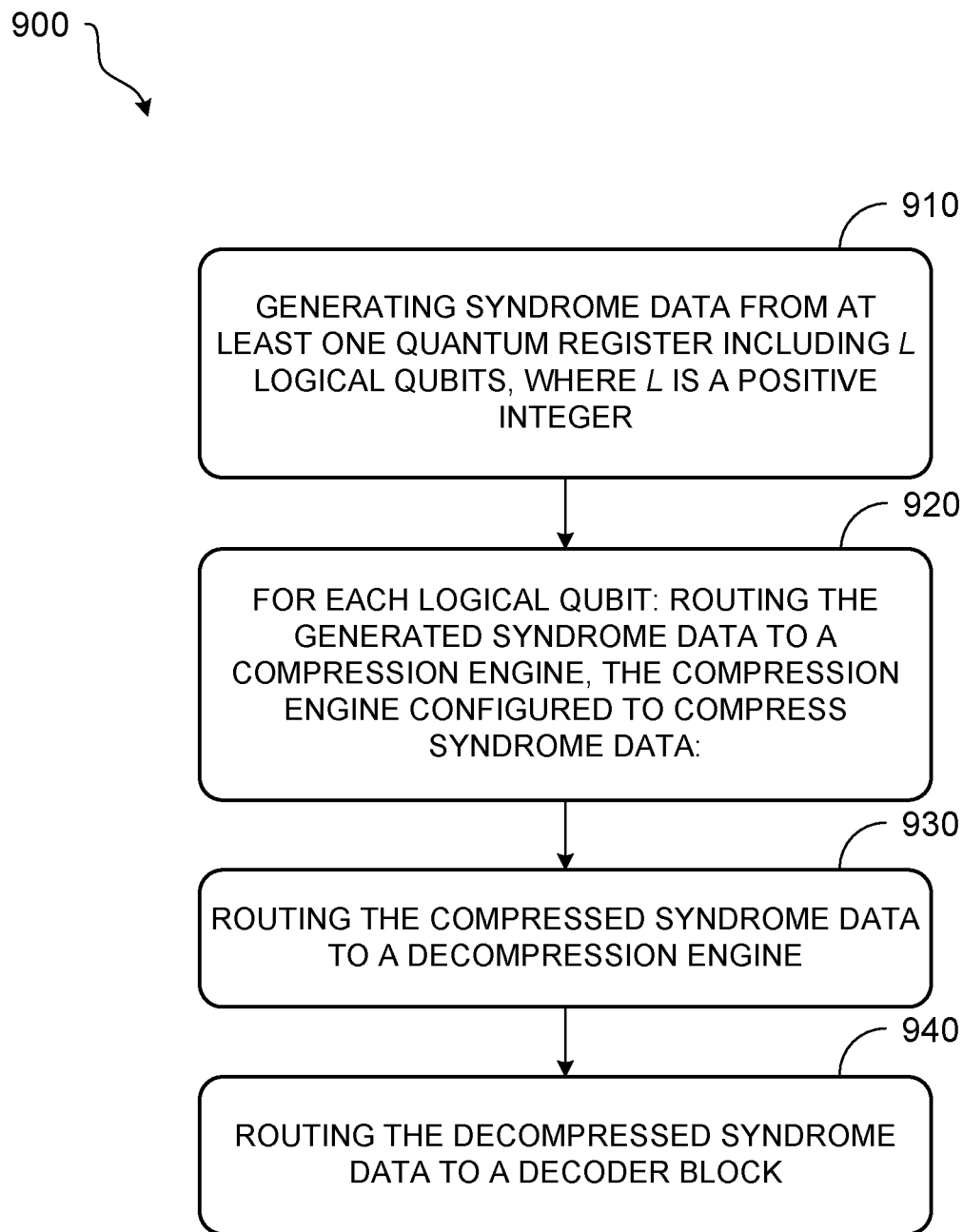
FIG. 9 shows an example method for compressing syndrome data within a quantum computing device.

FIG. 9 shows an example method 900 for compressing syndrome data within a quantum computing device. In some examples, method 900 may be implemented by a quantum computing device comprising a hardware implementation of the Union-Find decoder, such as the decoder schematically depicted in FIG. 12.

At 910, method 900 includes generating syndrome data from at least one quantum register including l logical qubits, where l is a positive integer. The generated syndrome data may include at least X syndrome data and Z syndrome data.

At 920, method 900 includes, for each logical qubit: routing the generated syndrome data to a compression engine, the compression engine configured to compress syndrome data. The quantum computing device may include a plurality of compression engines. In some examples, at least one of the compression engines is configured to compress the syndrome data using dynamic zero compression. In some examples, at least one of the compression engines is configured to compress the syndrome data using sparse representation. In some examples, at least one of the compression engines is configured to compress the syndrome data using geometry-based compression. The quantum computing device may include two or more sectors of logical qubits that are coupled to two or more types of compression engine. In some examples, method 900 may include operating the compression engine at 4 K. However, higher (e.g., 8 K) or lower (e.g., 2 K) temperatures may be used.

Figure 10:
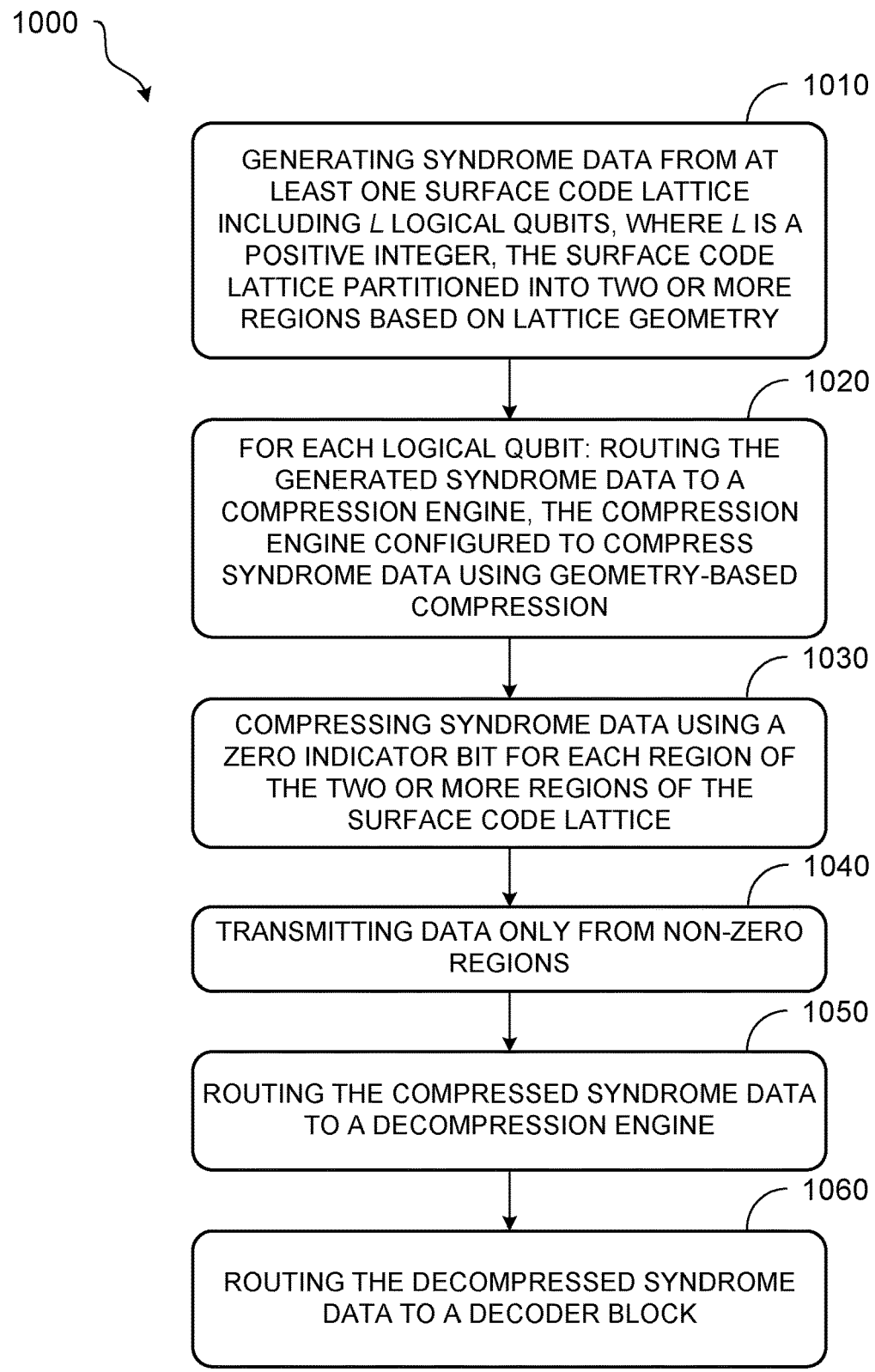
FIG. 10 shows an example method for compressing syndrome data within a quantum computing device using a geometry-based compressor.

Continuing at 930, method 900 includes, routing the compressed syndrome data to a decompression engine, the decompression engine configured to: receive compressed syndrome data; and decompress the received compressed syndrome data. At 940, method 900 includes routing the decompressed syndrome data to a decoder block. In some examples, the decompressed syndrome data may be routed to a Graph-Generator module of the decoder block. In some examples, method 900 may include operating the decompression engine and/or the decoder blocks at 77 K. However, higher (e.g., 85 K) or lower (e.g, 70 K) temperatures may be used. In some examples, the quantum computing device comprises a set of d decoder blocks, where d<2*l FIG. 10 shown an example method 1000 for compressing syndrome data using geometry-based compression within a quantum computing device. In some examples, method 1000 may be implemented by a quantum computing device comprising a hardware implementation of the Union-Find decoder, such as the decoder schematically depicted in FIG. 12.

At 1010, method 1000 includes generating syndrome data from at least one surface code lattice including l logical qubits, where l is a positive integer, the surface code lattice partitioned into two or more regions based on lattice geometry, as shown in FIG. 8, for example. In some examples, the number of regions may be determined based on an expected number of data blocks that contain trivial syndromes.

At 1020 method 1000 includes, for each logical qubit: routing the generated syndrome data to a compression engine, the compression engine configured to compress syndrome data using geometry-based compression. At 1030, method 1000 includes compressing syndrome data using a zero indicator bit for each region of the two or more regions of the surface code lattice. At 1040, method 1000 includes transmitting syndrome data only from non-zero regions. In other words, it may be assumed, that if data is not received from a region, the region only includes trivial (e.g., all-zero) data.

At 1050, method 1000 includes routing the compressed syndrome data to a decompression engine, the decompression engine configured to: receive compressed syndrome data; and to decompress the received compressed syndrome data. The decompression engine may be programmed based on the geometry-based compression scheme used by the compression engine A decoder in QEC is used to process syndrome measurement data and identify errors which corrupt data qubits. Herein, improvements are made to the micro-architecture for a hardware implementation of the Union-Find decoder for surface code. In surface code, measurement of local operators on a lattice of qubits and processing the syndrome using a decoder generates an estimate of the most likely errors on the data qubits. The decoder micro-architecture is designed to prevent accumulation of errors while keeping the hardware complexity low to meet the strict power budgets of operation in a cryogenic environment. The architecture presented herein is designed to support scaling up to thousands of logical qubits to enable fault-tolerant quantum computing.

Quantum error decoding is an NP-hard problem. Therefore, most decoding algorithms trade-off error thresholds for lower time and algorithm complexity. One promising error decoding technique is the graph-based Minimal Weight Perfect Matching (MWPM) decoder. Although it offers high error thresholds, MWPM decoder suffers from high time complexity ($O(n^2)$). Alternately, a simple approach to design decoders is based on using a look-up table. The table is indexed by the syndrome bits and the corresponding entry stores the error information for the data qubits. However, look-up table decoders are not scalable and require terabytes of memory even for small code distances. Deep neural decoders are popular and learn the probability density functions of the possible errors corresponding to the sequences of measured syndromes in the training phase. Using inference, the error pattern for a given syndrome is evaluated. However, neural decoders require more hardware for computing and are not scalable when the code distance increases. The recently proposed Union-Find decoder presents an algorithm that forms clusters around non-trivial syndromes (non-zero syndromes) and uses graph traversal to correct errors in almost linear time. The Union-Find decoder thus offers simplicity, time complexity, and high error thresholds.

Figure 11:
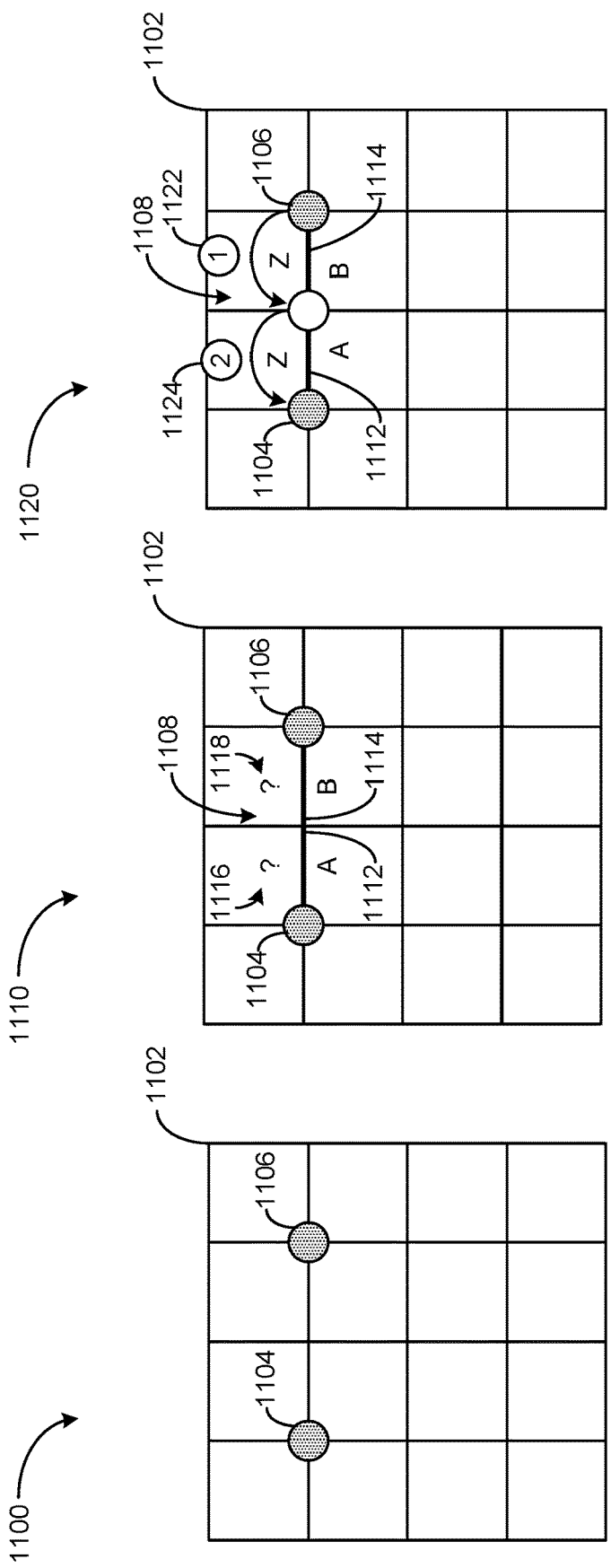
FIG. 11 schematically shows an example decoder design.

The operation of the Union-Find decoder is shown in FIG. 11. At 1100, each edge on the graph 1102 represents a data qubit and each vertex represents a parity qubit (e.g., 1104, 1106). Decoding starts by growing spanning forests 1108 to cover all the erroneous syndrome bits to form one or more even clusters as shown at 1110. Data qubits A 1112 and B 1114 can be assigned unknown Pauli errors 1116 and 1118, respectively. By traversing through the forest, errors can be detected as shown at 1120. Cluster traversal steps (shown at 1122, 1124) may be used to detect, classify (e.g., Z errors), and correct errors.

Figure 12:
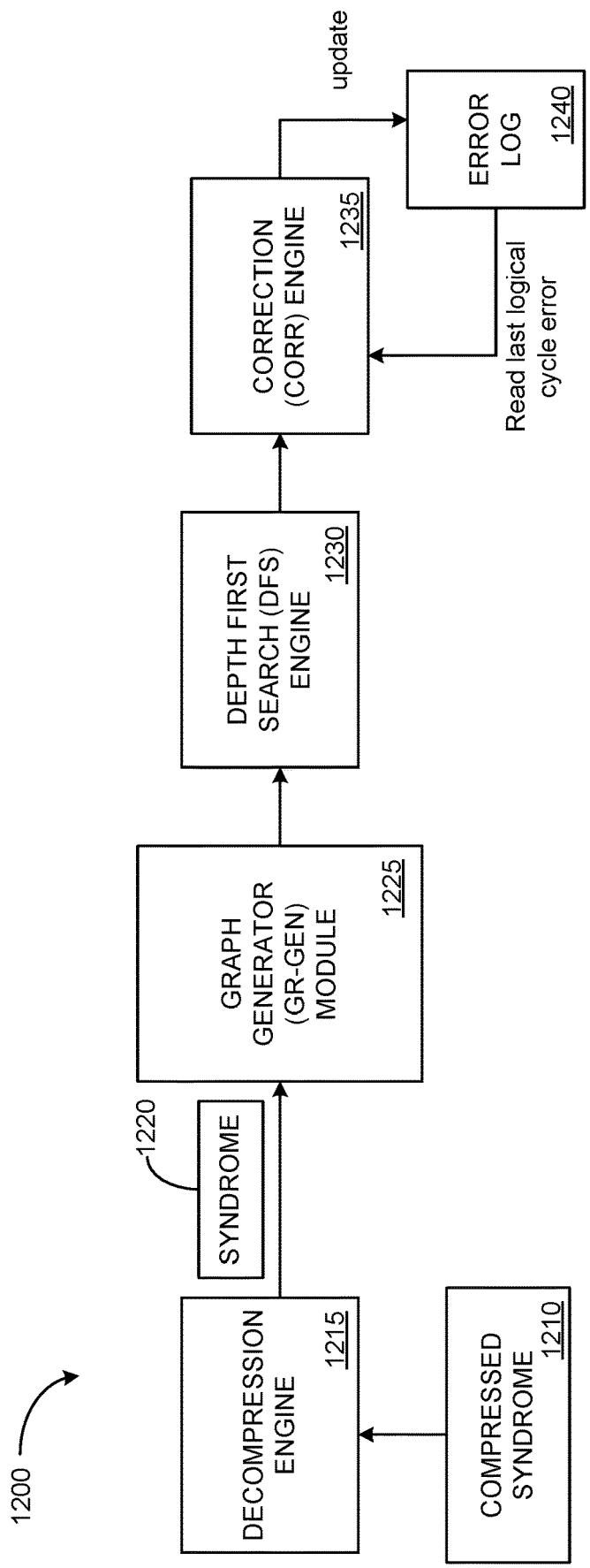
FIG. 12 schematically shows an example Union-Find Decoder.

An adaptation of this algorithm may be implemented, as shown in block diagram 1200 of FIG. 12. Compressed syndrome data 1210 is routed to a decompression engine 1215. Decompressed syndrome data 1220 is then routed to a Graph Generator (Gr-Gen) module 1225. Gr-Gen module 1225 may be configured to generate spanning tree memory (STM) data. A Depth-First Search (DFS) engine 1230 may be configured to access the STM data, and to generate edge stacks based on the STM data. Correction (Corr) engine

1235 may be configured to access the edge stacks, generate memory requests based on the accessed edge stacks, and to update an error log 1240.

If syndrome measurement errors are ignored, the decoding is performed using 2D graphs generated from a single round of syndrome measurement. In order to account for faulty measurements, d consecutive rounds of syndrome measurements must be decoded together, where d is the code distance, leading to 3D graphs. The Union-Find decoder may be used in both of these cases. The main difference is the amount of memory required which grows quadratically (for 2D) or cubically (for 3D) with the code distance of the surface code. The micro-architecture of the Union-Find decoder is described herein in 2D for the sake of simplicity and generalized for 3D. All relevant results described are obtained for 3D graphs. The decoding design includes of 3 pipeline stages, enabling improved design scaling.

Figure 13:
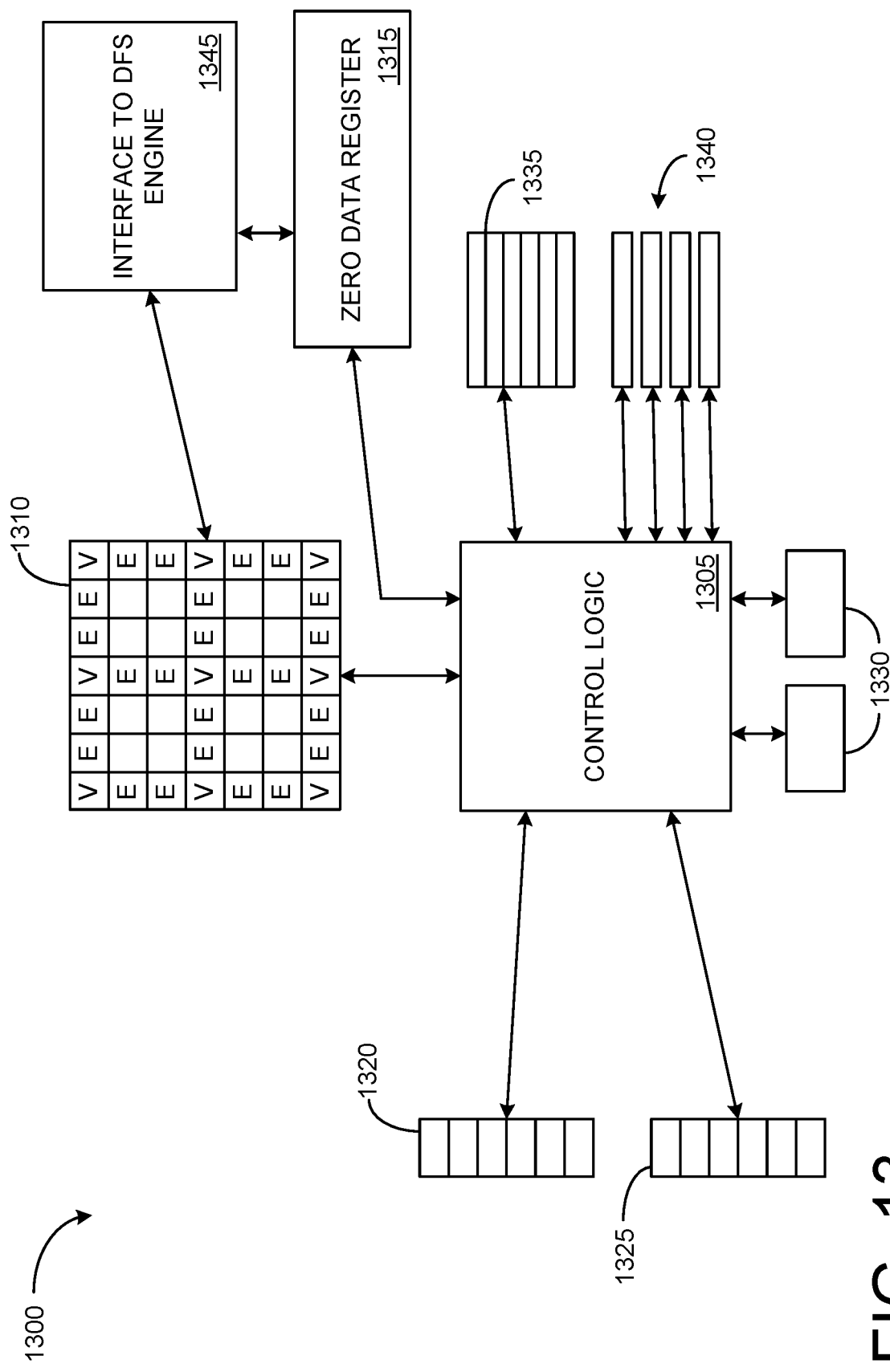
FIG. 13 schematically shows an example Graph Generator module.

The Gr-Gen module takes the syndrome as an input after decompression and generates a spanning forest by growing clusters around non-trivial syndrome bits (non-zero syndrome bits). The spanning forest may be built using two fundamental graph operations: Union( ) and Find( ). FIG. 13 schematically shows an example Gr-Gen module 1300. Module 1300 includes the Spanning Tree Memory (STM) 1310, a Zero Data Register (ZDR) 1315, a root table 1320, a size table 1325, parity registers 1330, and a fusion edge stack (FES) 1335. This design is slightly different from the previously described Union-Find algorithm to reduce the cost of hardware resources. The size of each component is a function of the code distance d STM 1310 stores 1 bit for each vertex, and 2 bits per edge. 2 bits per edge are used since clusters grow around a vertex or existing cluster boundary by half edge width as per the original algorithm. The ZDR 1315 stores 1 bit per STM row. If the contents of a row are 0, the bit stores a 0, and if at least one of the bits in a row is 1, the ZDR bit for the corresponding row stores a 1. Since syndrome data is sparse and the total number of edges in the spanning forest will below, the ZDR 1315 speeds up the STM 1310 traversal. FES 1335 stores the newly grown edges so that they can be added to existing clusters. The root table 1320 and size table 1325 store the root and size of a cluster respectively. The tree traversal registers 1340 store the vertices of each cluster visited in the Find( ) operation. An interface 1345 between the Gr-Gen module and a DFS engine may allow the DFS engine to access data stored at STM 1310.

Figure 14:
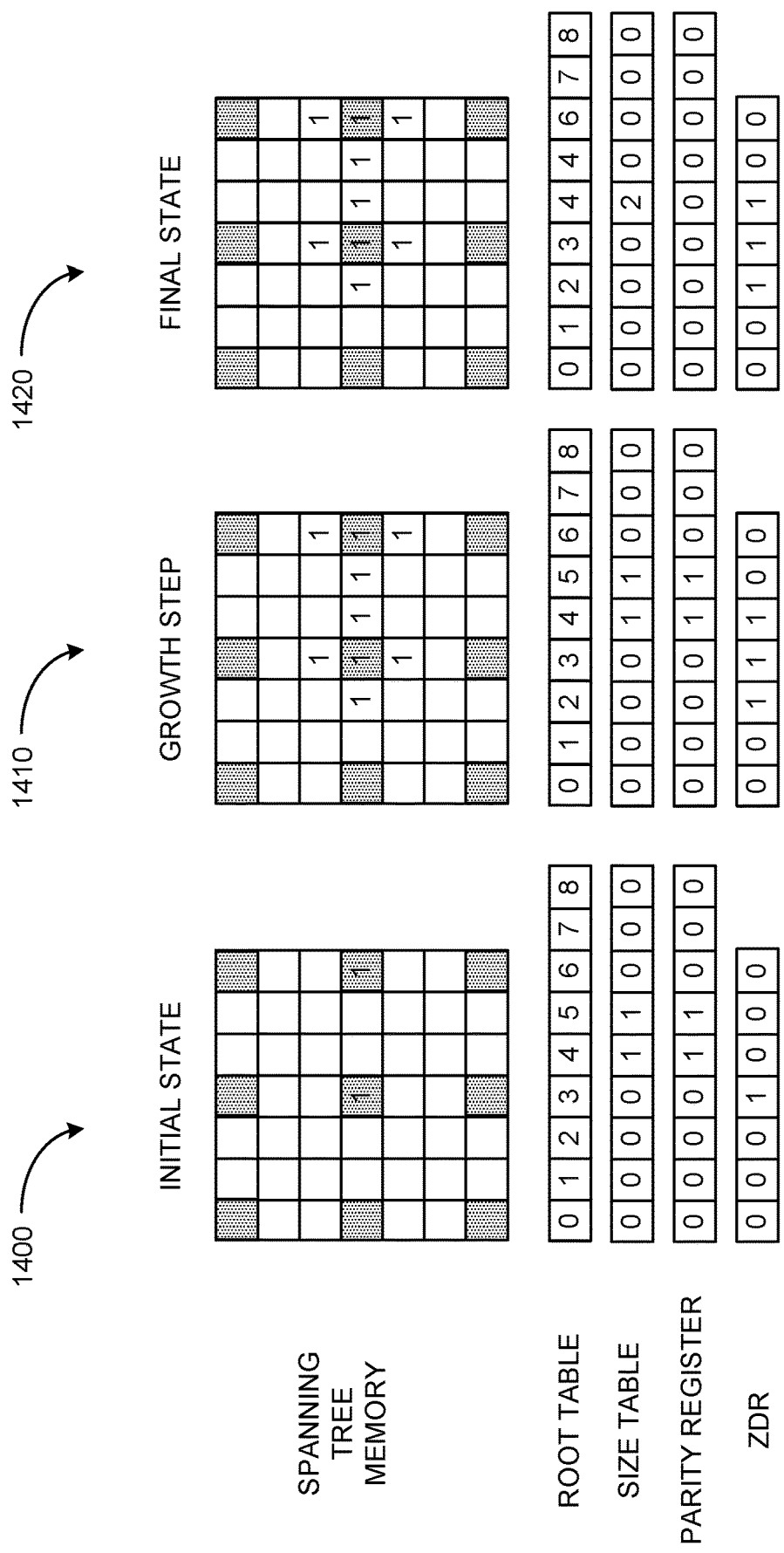
FIG. 14 schematically shows the state of the major components in the Graph Generator module during in graph generation.

The root table entries (Root Table[i]) are initialized to the indices (i) as shown in FIG. 14. The size table entries for the non-trivial syndrome bits are initialized to 1 as shown at 1400. These tables aid the Union( ) and Find( ) operations to merge clusters after the growth phase, as shown at 1410, into a final state, as shown at 1420. They are indexed by cluster indices. The tables are sized for the maximum number of clusters possible which equals to the total number of vertices in the surface code lattice. The boundary list of each cluster may be stored. However, the average cluster diameter is very small in the noise regime that is relevant for practical applications. Cluster diameter may be defined as the maximum distance between two vertices on a cluster boundary. Thus, the boundary list may not be stored, and instead the boundary indices may be computed in the cluster growth phase. The original algorithm grows all odd clusters until the parity is even. Thus, odd clusters must be detected quickly. To do the same, parity registers may be used as shown in FIG. 11. The parity registers may store 1 bit parity per cluster depending upon whether it is odd or even. For a reasonable code distance of 11, seven 32-bit registers may be sufficient. For larger code distances, the additional parity information may be stored in the memory and read in advance in order to hide the memory latency.

Figure 15:
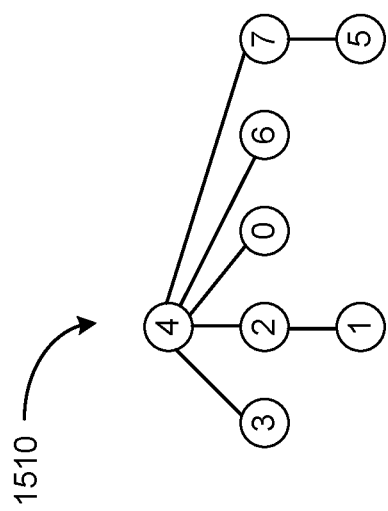
FIG. 15 schematically shows example clusters and root table entries.
Figure 15:
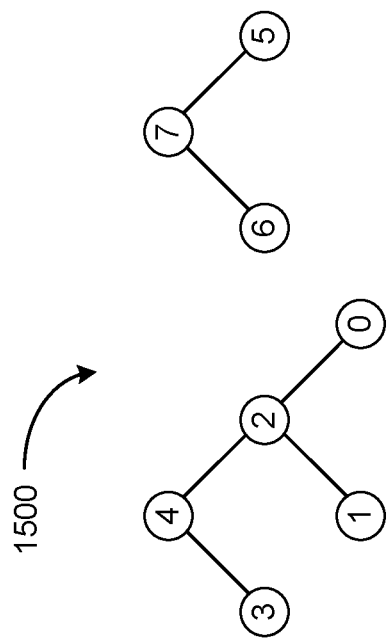

The control logic may read the parity registers and grow clusters with odd parity (called the growth phase) by writing to the STM, ZDR, and adding newly added edges that touches other cluster boundaries to the FES. The STM may not be updated for edges that connect to other clusters to prevent double growth. It may be updated when clusters are merged by reading from the FES. The logic may check if a newly added edge connects two clusters by reading the root table entries of the vertices connected by the edge (call these the primary vertices). This is equivalent to the Find( ) operation. The vertices visited on the path to find the root of each primary vertex are stored on the tree traversal registers as shown at 1500 in FIG. 15. The root table entries for these vertices may be updated to directly point to the root of the cluster to minimize the depth of the tree for future traversals, as shown at 1510. This operation, called path compression, is included in Union-Find algorithms and allows for keeping the depth of the trees short, amortizing the cost of the Find( ) operation. For example, at 1500, FIG. 15 shows the state of two clusters and a root table at some instant of time. Assume that after a growth step, vertices 0 and 6 are connected and the two clusters must be merged. The tree traversal registers may be used to update the root of vertex 0 as shown at 1500. Since the depth of the tree is continuously compressed, only a few registers are sufficient. In one example, 5 registers are used per primary vertex, though more or fewer registers may also be used. If the primary vertices belong to different clusters, the root of the smaller cluster may be updated to point to the root of the larger cluster.

The DFS engine may process the STM data produced by the Gr-Gen that stores the set of grown even clusters. It may use the DFS algorithm to generate the list of edges that forms a spanning tree for each cluster in the STM. In other examples, a breadth first search exploration may be used, though DFS is generally more memory efficient. An example DFS engine is shown at 1600 of FIG. 16. The logic may be implemented using a finite state machine 1610 and two stacks 1620 and 1622. Stacks may be used since the order in which edges are visited in the spanning tree may be reversed to perform correction by peeling. The edge stack 1620 may store the list of visited edges while the pending edge stack 1622 may store the edges that will be visited in the on-going DFS later. For example, as shown at 1630 of FIG. 16, when the FSM visits vertex 1 of the spanning forest, edge a is pushed to the edge stack and edge cis pushed to the pending edge stack. When the end of the current path is reached, pending edges may be popped and traversed. To enable pipelining and improve performance, the micro-architecture may be designed to include an alternate edge stack 1632. When there is more than one cluster, the correction engine, via Corr engine interface 1640, may work on the edge list of one of the traversed clusters when the DFS engine traverses through the other. As shown at 1630, if edges a, b, c, and d belong to cluster C0 and edges e and f belong to cluster C1, when the Corr Engine processes corrections for C0, DFS engine 1600 may traverse through C1. This may help in sizing the stacks to deal with the average cluster size rather than the worst-case cluster size. In a case where DFS Engine 1600 encounters a sufficiently large cluster which cannot fit in one stack, alternate stack 1632 may be used and an overflow bit may be set to indicate that both stacks 1620 and 1632 hold edges corresponding to a single cluster. This proposed implementation may include a number of memory reads that is directly proportional to the size of the clusters. By going over STM 1310 row-wise, the effective cost of generating clusters is reduced. ZDR 1315 reduces the cost of traversing STM 1310 row-wise.

Figure 17:
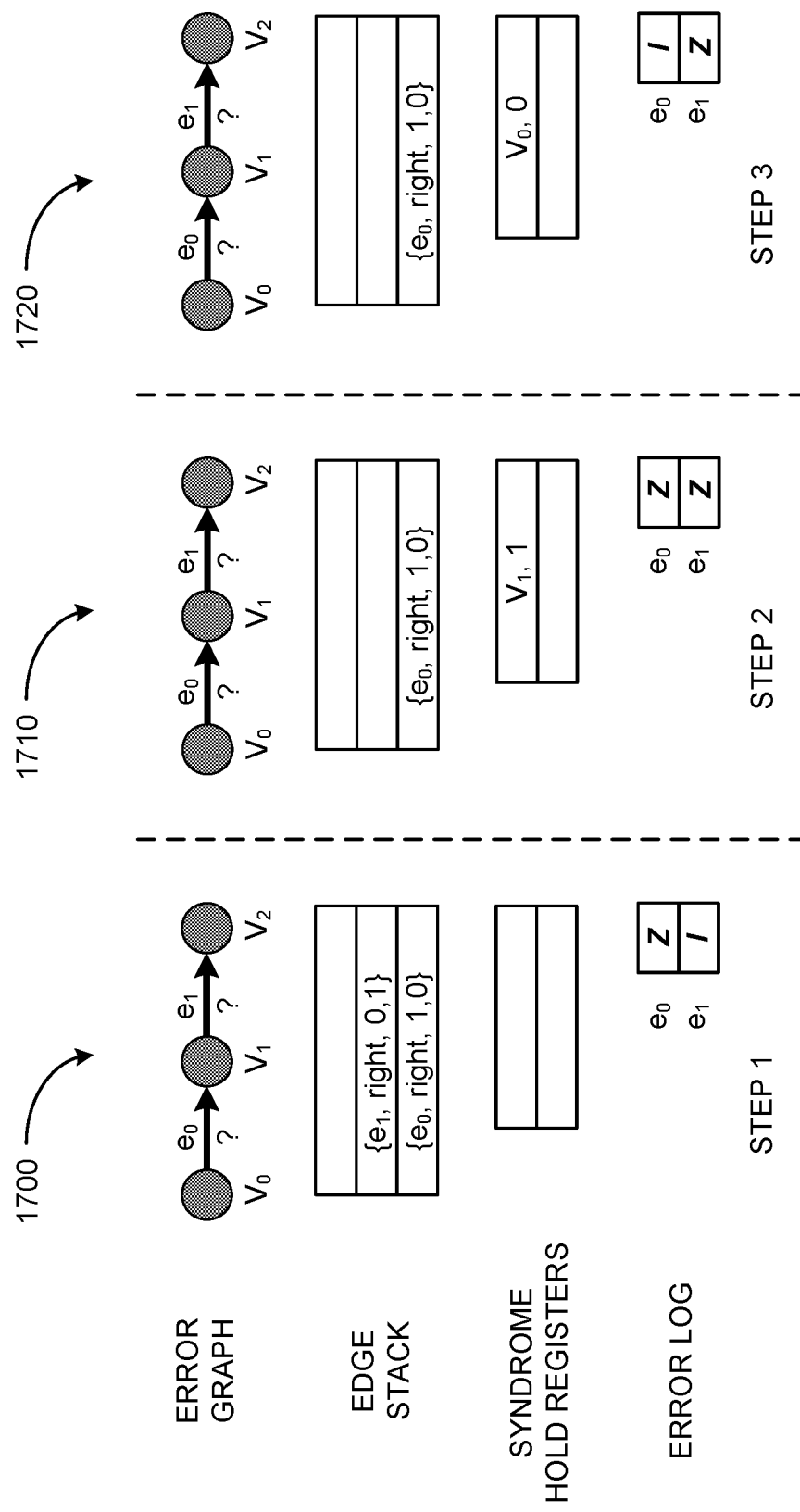
FIG. 17 shows examples of peeling for an example error graph performed in the Correction Engine.

The Corr Engine may perform the peeling process of the decoder and may identify the Pauli correction to apply. The Corr engine may access the edge list (which is stored on the stack) and syndrome bits corresponding to the vertices along the edge list. The syndrome bits may be accessed by decompressing the compressed syndrome and/or by accessing the STM. However, the former may increase the logic complexity and latency while the latter may increase the number of memory requests that the STM is required to handle. To reduce the memory traffic and eliminate the need for additional decompression logic, the syndrome information may be saved along with the edge index information by the DFS Engine. The temporary syndrome changes caused by peeling are saved on local registers. Examples of peeling for an example error graph performed in the Corr Engine are shown in FIG. 17. Example syndrome hold registers, error logs, edge stacks, and error graphs are shown in FIG. 17 for step 1 1700, step 2 1710, and step 3 1720. The Corr Engine may also read the last surface code cycle error log and may update the Pauli correction for the current edge. For example, if the error on an edge e0 was Z in the previous logical cycle and it encounters a Z error in the current cycle too, the Pauli error for e0 may be updated to I as shown at 1720.

Figure 18:
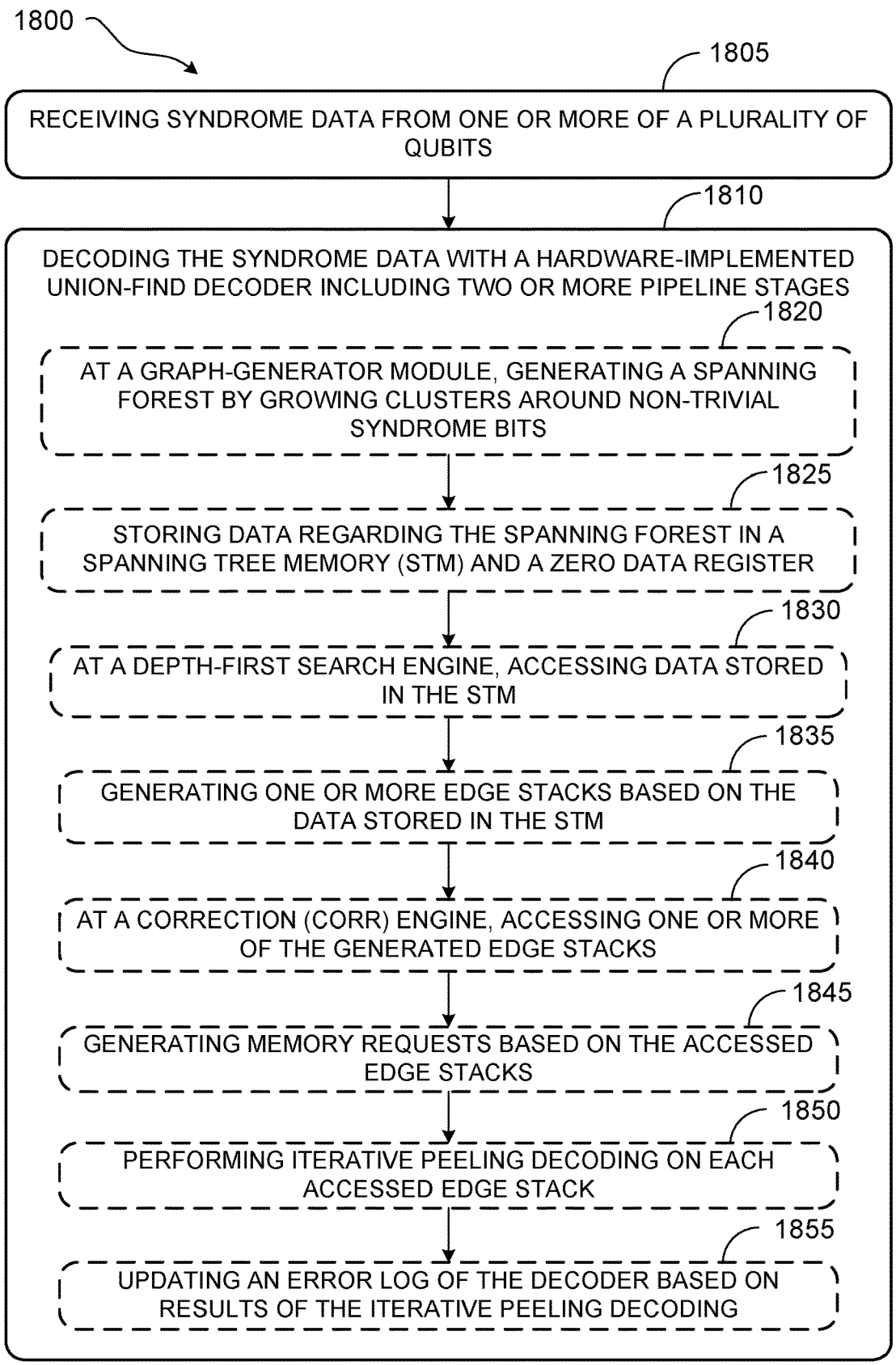
FIG. 18 shows an example method for implementing a pipelined version of a hardware Union-Find decoder.

FIG. 18 shows an example decoding method 1800 for a quantum computing device. In some examples, decoding method 1800 may be implemented by a quantum computing device comprising a hardware implementation of the Union-Find decoder, such as the decoder schematically depicted in FIG. 12.

At 1805, method 1800 includes receiving syndrome data from one or more of a plurality of qubits, such as logical qubits residing in a quantum register. The received syndrome data may include X syndrome data and/or Z syndrome data.

At 1810, method 1800 includes decoding the received syndrome data with a hardware implemented Union-Find decoder including two or more pipeline stages. As an example, this may include the hardware implemented Union-Find decoder shown in FIG. 12 which includes three pipeline stages: a Graph-Generator module stage, a depth-first search engine stage, and a Correction engine stage. However, any number or combination of two or more pipeline stages may be used.

Optionally, at 1820, decoding the syndrome data may include, at a Gr-Gen module, generating a spanning forest by growing clusters around non-trivial syndrome bits. In some examples, the spanning forest may be generated using Union( ) and Find( ) graph operations.

Optionally, at 1825, decoding the syndrome data may include, at the Gr-Gen module, storing data regarding the spanning forest in a spanning tree memory (STM) and a zero data register. In some examples, newly grown edges may be stored at a fusion edge stack.

Figure 16:
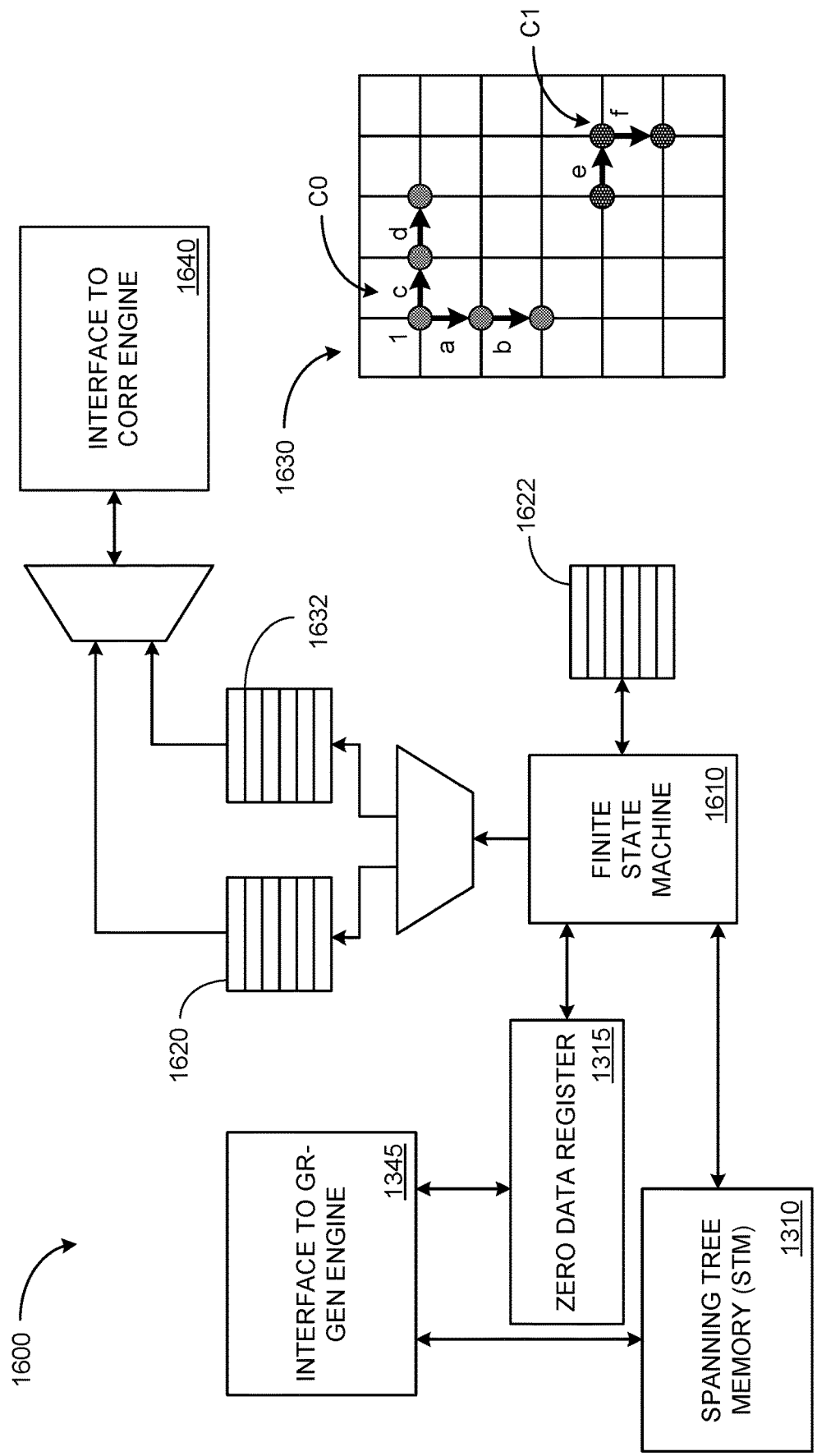
FIG. 16 schematically shows a Depth First Search Engine and an example graph for error correction.

Optionally, at 1830, decoding the syndrome data may include, at a DFS engine, accessing data stored in the STM. Optionally, at 1835, decoding the syndrome data may include, at the DFS engine, generating one or more edge stacks based on the data stored in the STM. For example, as shown in FIG. 16, generating one or more edge stacks based on the data stored in the STM may include generating a primary edge stack including a list of visited edges. Additionally or alternatively, generating one or more edge stacks based on the data stored in the STM may include generating a pending edge stack including a list of edges that will be visited. Additionally or alternatively, generating one or more edge stacks based on the data stored in the STM may include generating an alternate edge stack configured to hold surplus edges from a cluster of the spanning forest.

Optionally, at 1840, decoding the syndrome data may include, at a Corr engine, accessing one or more of the generated edge stacks. Optionally, at 1845, decoding the syndrome data may include, at the Corr engine, generating memory requests based on the accessed edge stacks. Optionally, at 1850, decoding the syndrome data may include, at a Corr engine, performing iterative peeling decoding on each accessed edge stack. Optionally, at 1855, decoding the syndrome data may include, at a Corr engine, updating an error log of the decoder based on results of the iterative peeling decoding.

As discussed herein, decoding based on a single round of measurement will not account for syndrome measurement errors. To handle measurement errors, decoders examine d (code distance) rounds of measurement. This type of error correction may be handled with minimal changes to the design. For example, instead of forming graphs on a 2D plane, the decoder may analyze 3D graphs. Each vertex may be connected to a maximum of 4 neighbors. Whereas, for the 3D graphs, each vertex may now have up to two additional edges corresponding to the previous and next round of measurement. To reduce the storage overheads an STM per round of syndrome measurement may be stored. The STM may be optimized such that each row of the STM stores the vertices of a row of the surface code lattice, edge information for the vertices of the next row, and edge information connecting the corresponding vertices in the surface code lattice of the next round.

The compression techniques described herein may reduce the amount of memory required to store syndrome data and error log for the data qubits. However, the micro-architecture of the Union-Find decoder also uses memory and the total capacity required is far from the total capacity offered by superconducting memories. Thus, this design may be implemented by operating at 77 K using conventional CMOS. This may also reduce the thermal noise generated in the cryogenic environment close to the quantum substrate as the design is physically located far from the quantum substrate.

Figure 19:
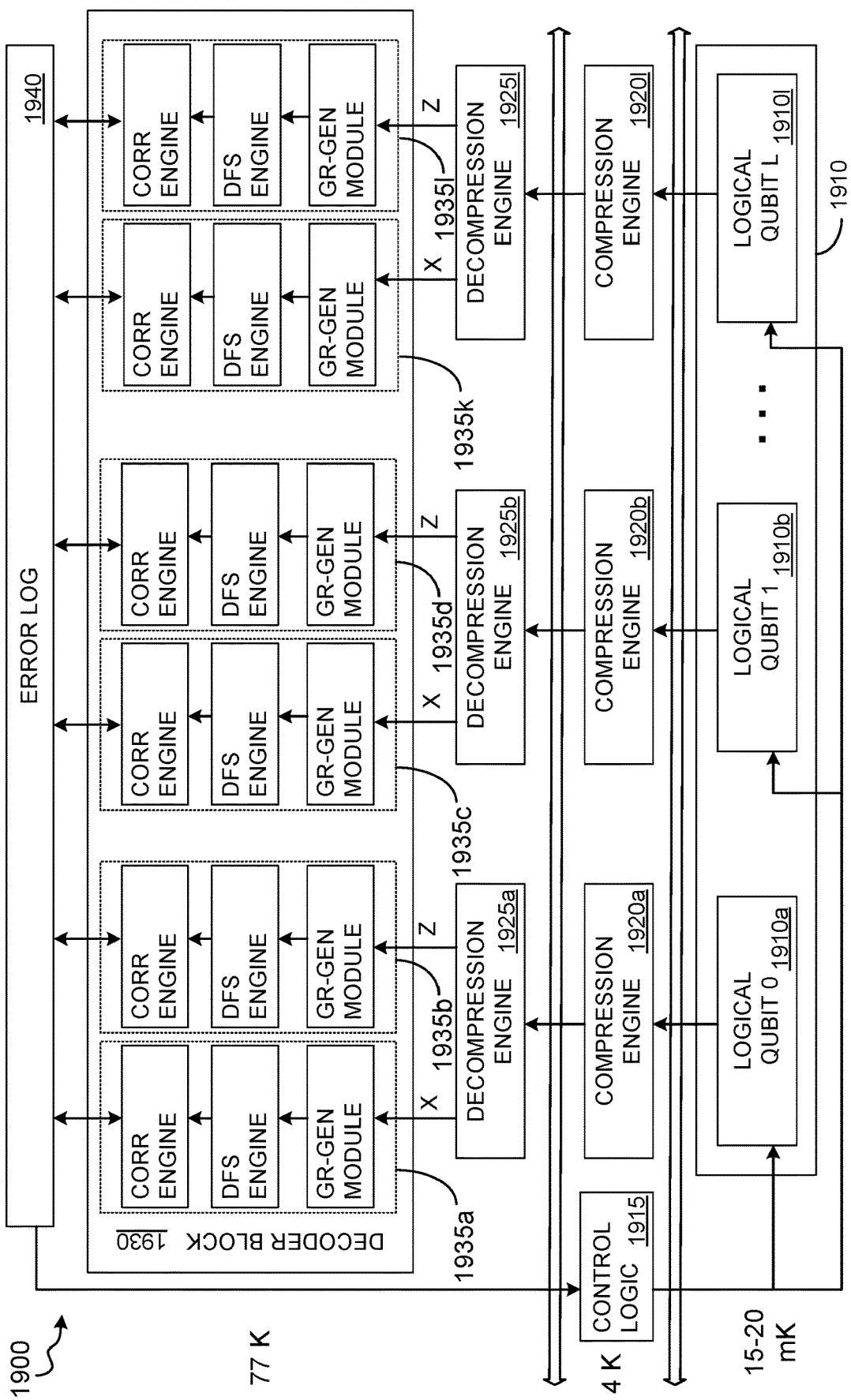
FIG. 19 schematically shows a baseline organization for L logical qubits.

For the baseline design, a naive implementation may allocate a decoder for each X syndrome and Z syndrome for each logical qubit as shown at 1900 of FIG. 19. FIG. 19 schematically shows the system organization for a large number of logical qubits (L) within a quantum register 1910. Quantum register 1910 is shown to include logical qubit 0 1910*a*, logical qubit 1 1910*b*, and logical qubit 1 1910*l* as representative logical qubits operating at 15-20 mK. Each logical qubit is configured to receive signals from control logic 1915 and to output syndrome data to a compression engine (e.g., 1920*a*, 1920*b* . . . 1920*l*). Both control logic 1915 and compression engines 1920*a* . . . 1920*l* are shown as operating at 4 K, a higher temperature than for the quantum register. However, higher (e.g., 8 K) or lower (e.g., 2 K) temperatures may be used.

Each compression engine routes compressed syndrome data to a decompression engine (1925*a*, 1925*b* . . . 1925*l*) operating at 77 K. The decompression engines decompress the compressed syndrome data, and route decompressed X and Z syndrome data to decoding block 1930. In this example, each decompression engine is coupled to a pair of pipelined Union-Find decoders (1935*a*, 1935*b*, 1935*c*, 1935d ... 1935k, 1935l) operating at 77 K. Each Union-Find decoder analyzes syndrome data received from a decompression engine and updates error log 1940. Although shown as operating at 77 K, higher (e.g., 85 K) or lower (e.g, 70 K) temperatures may be used for operating the decompression engines and decoders, though the operating temperature for the decompression engines and decoders may generally be higher than that for the compression engines.

Thus, for the baseline design, the decoding logic may use 2L Union-Find decoders per logical qubit. In this implementation, each logical qubit uses its own dedicated decoders. However, the utilization of each pipeline stage may vary. Hence, the architecture shown at 1900 may not provide the optimal allocation of resources. For a large number of qubits, the on-chip components are under-utilized and dissipate heat. Since the entire system is operated at 77 K, an increased power dissipation linearly increases the cost of cooling.

As such, the architecture of a decoder block may be used that includes reduced number of pipeline units. An example design for such a decoder block is shown at 2000 of FIG. 20. A qubit register 2005 comprising a plurality of logical qubits transmits syndrome data to a set of Gr-Gen modules. Groups of Gr-Gen modules 2010 may share one or more DFS Engines 2020 and groups of DFS Engines 2020 may share one or more Corr Engines 2030. The hardware overhead includes a first set of multiplexors 2035 coupling groups of Gr-Gen modules 2010 to one DFS Engine 2020, and a second set of multiplexors 2040 coupling groups of DFS Engines 2020 to one Corr Engine 2030. Memory requests generated by the Corr Engines 2030 may be routed to the correct memory locations using a demultiplexor 2045. The select logic 2050 may prioritize the first ready component and may use round robin arbitration to generate appropriate select signals for multiplexors 2035 and 2040. For example, if four Gr-Gen modules 2010 share a DFS Engine 2020, and the 2nd Gr-Gen module finishes cluster formation earlier than other modules, it may get access to the corresponding DFS Engine 2020 first. The round robin policy thus ensures fairness while sharing resources.

Figure 21:
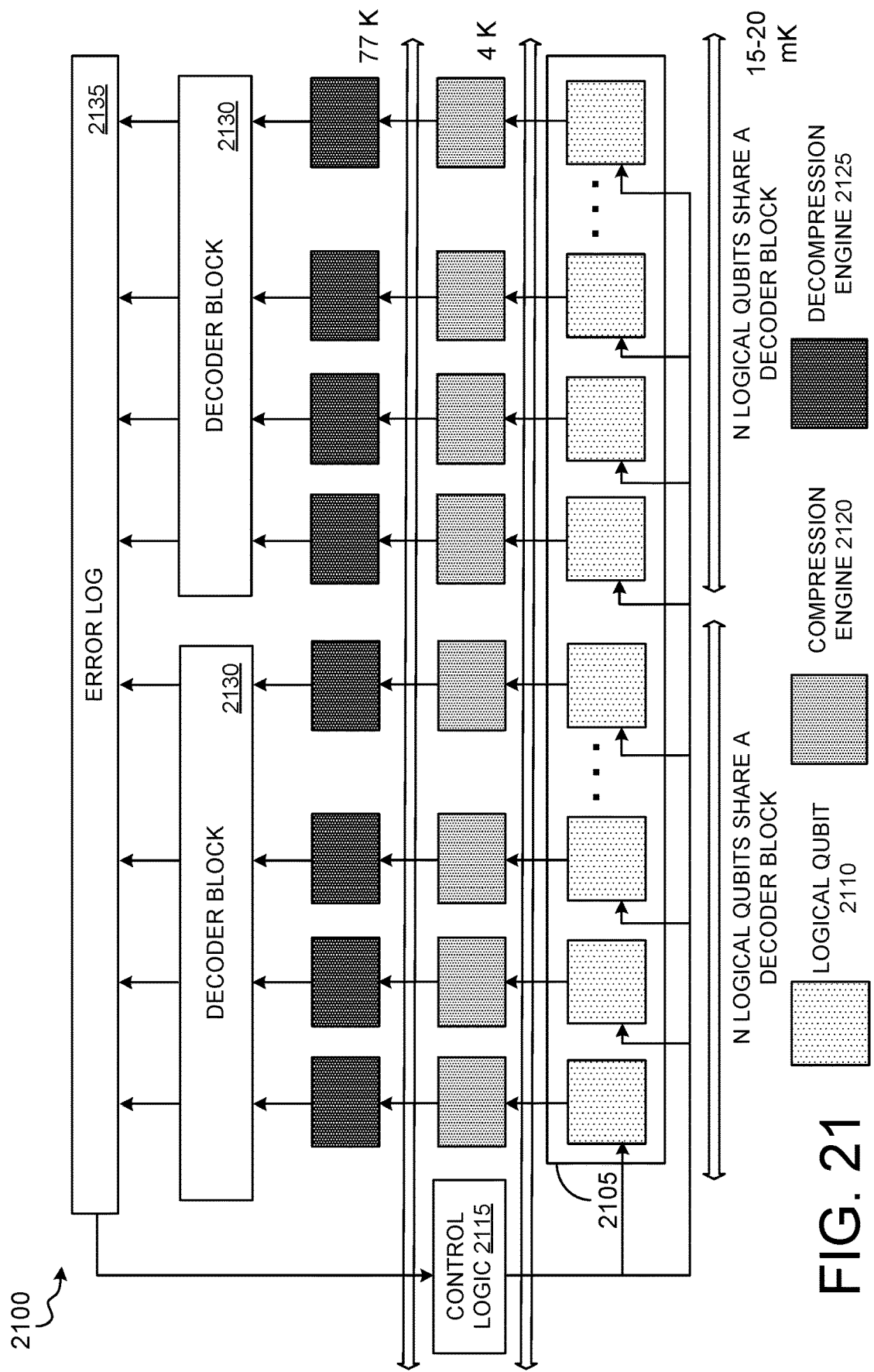
FIG. 21 schematically shows an example micro-architecture of a scalable fault-tolerant quantum computer.

An example system architecture is shown at 2100 of FIG. 21. A qubit register 2105 comprises a plurality of logical qubits 2110 coupled to control logic 2115. Each logical qubit is coupled to a compression engine 2120, which, in turn is each coupled to decompression engine 2125. A block of N logical qubits 2110 share a decoder block 2130, which updates error log 2135 for each coupled logical qubit 2110. As described with regard to FIG. 19, operating temperatures may vary from the indicated temperatures of 4 K and 77 K. If N logical qubits share a decoder block 2130, for a quantum register 2105 with L logical qubits 2110, the total number of decoder blocks 2130 required is L/N. An example micro-architecture uses L Gr-Gen modules, (a)L DFS Engines, and (b)L Corr Engines. Resource savings depend on parameters (a) and (b). The values of (a) and (b) may be calculated to minimize the overall hardware cost. This may be framed as an optimization problem subject to constraints.

One way to do decoding for large scale systems is to allocate one decoder to each logical qubit. However, this approach incurs a linear growth in terms of hardware and therefore in power costs. As such, this design is not very efficient and is not inherently scalable. The designs herein enable the reuse of specific design components in order to reduce the practical costs when the decoder block is scaled for a large number of logical qubits.

Resources may be shared within the decoding units and/or across entire decoding units. Considering the distribution of decoding times, it is unlikely that several very lengthy syndrome vectors need to be decoded simultaneously, so resources may be shared.

This sharing is independent of the decoder or decoding algorithm, including in cases where the decoding algorithm has a runtime that is dependent on the syndrome, and so some syndromes may be more difficult or lengthier to decode than others. For example, some machine learning based decoders are not syndrome dependent. A machine learning decoder may have multiple layers of neural networks. Once decoding is performed for one qubit on the first layer, the second qubit can use the first layer while the first qubit is working on the second layer of the network.

Figure 22:
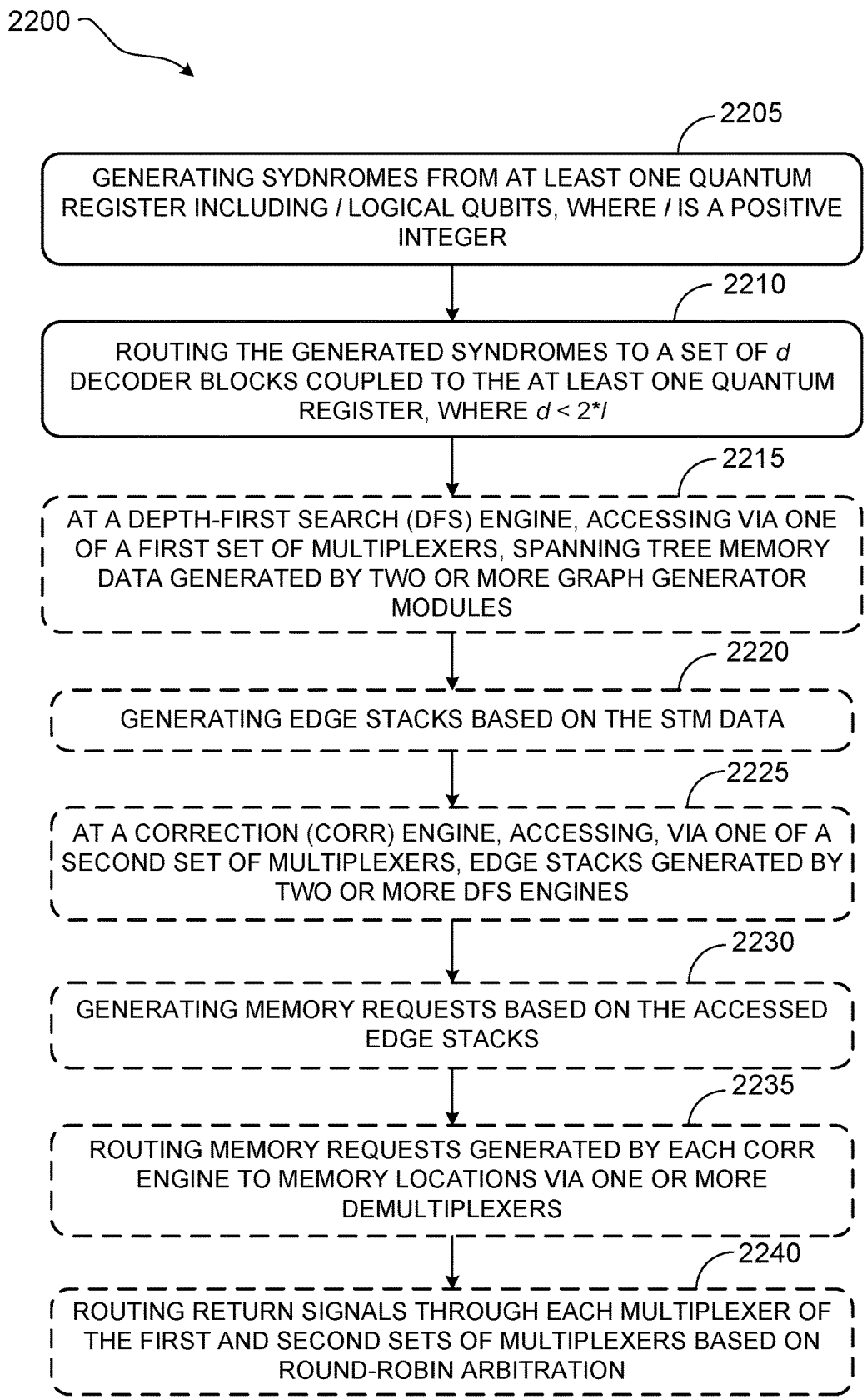
FIG. 22 shows an example method for routing syndrome data within a quantum computing device.

FIG. 22 shows an example method 2200 for a quantum computing device. Method 2200 may be executed by a multiplexed quantum computing device, such as the computing devices shown in FIGS. 20 and 21. At 2205, method 2200 includes generating syndromes from at least one quantum register including l logical qubits, where l is a positive integer. The generated syndromes may include X syndromes and Z syndromes. At 2210, method 2200 includes routing the generated syndromes to a set of d decoder blocks coupled to the at least one quantum register, where d<2*l. As described with regard to FIGS. 20 and 21, this allows for scalability of the quantum computing device, as fewer than two decoders are needed to handle processing on both the X and Z syndromes for each logical qubit.

In some examples, each decoder block is configured to receive decoding requests from a set of n logical qubits, wherein n>1. In some examples, each decoder block comprises g Gr-Gen modules, where $0<g\le l$, each Gr-Gen module configured to generate spanning tree memory (STM) data based on the received syndromes. In some examples, each decoder block further comprises α*l DFS engines, where $0<\alpha<1$. In some examples, two or more Gr-Gen modules are coupled to each DFS engine via one of a first set of multiplexers Optionally, at 2215, method 2200 includes, at each DFS engine, accessing, via one of a first set of multiplexers, STM data generated by two or more Gr-Gen modules. Optionally, at 2220, method 2200 includes, at each DFS engine, generating edge stacks based on the STM data. In some examples, each decoder block further comprises β*l Corr engines, where $0<\beta<1$. In some examples, two or more DFS engines are coupled to each Corr engine via one of a second set of multiplexers.

Optionally, at 2225, method 2200 includes, at each Corr engine, accessing, via one of a second set of multiplexers, edge stacks generated by two or more DFS engines. Optionally, at 2230, method 2200 includes, generating memory requests based on the accessed edge stacks. Optionally, at 2235, method 2200 includes, routing memory requests generated by each Corr engine to memory locations via one or more demultiplexers. Optionally, at 2240, method 2200 includes routing return signals through each multiplexer of the first and second sets of multiplexers based on round-robin arbitration.

Error correction is successful when d rounds of syndrome measurements are decoded within a logical cycle (T), which limits the maximum latency that can be tolerated by the decoders. When a decoder fails to decode all the syndromes within a logical cycle, errors may go undetected. This type of failure may be referred to as timeout failure. Since decoders are imperfect and exhibit threshold behavior, there also exists a possibility of occurrence of logical error when the correction generated by the decoder changes the logical state of a qubit. Thus, the failure of a decoder may be attributed to either timeout failure or a logical error. To keep the error thresholds the same and prevent an increase of the system failure rate, the probability of a timeout failure ($p_{tof}$) must be lower than the probability of occurrence of a logical error ($p_{log}$) as shown in Equation (4). For the optimized design, resource sharing is possible as long as $p_{tof}$ is sufficiently small.

$$p_{tof} \leq p_{log} \tag{Eq. 4}$$

Assume N logical qubits with identical error rates sharing k decoding units. The total execution time to decode N logical qubits (r) is given by Equation (5):

$$\tau = \frac{1}{k}\sum_{i=1}^{N} \tau_i \tag{Eq. 5}$$

where ($\tau_i$) denotes the execution time of decoding the syndromes of the $i^{th}$ logical qubit. In this case, the probability of a timeout failure $p_{tof}$ must satisfy Equation (6).

$$p_{tof} = \mathbb{P}(\tau \geq T) \tag{Eq. 6}$$

The optimization goal is to minimize the number of decoding units k for a given number of logical qubits N such that the constraint given by Equation (4) is met. The $p_{tof}$ may be modeled using the execution time obtained from a simulator.

The decoder performance may be modeled by studying the number of reads. The write operations performed may be read-modify-write, and the writeback may not be on the critical path. 4 cycles latency were assumed for memory accesses and a 4 GHz clock frequency. The total number of memory requests in the Gr-Gen for a given syndrome is directly proportional to the cluster diameter (Di). Whereas, it is proportional to the size of the cluster (Si) in the DFS Engine and Corr Engine. The execution time spent in the Gr-Gen(TGG), DFS Engine(TDFS), and Corr Engine (TCE) for a syndrome with n clusters are given by Equations (7) and (8).

$$\tau_{GG} = \Sigma_i \Sigma_{n=1}^{D_i} n^2 \tag{Eq. 7}$$

$$\tau_{DFS} = \tau_{CE} = \Sigma_i S_i \tag{Eq. 8}$$

In the optimized design, each Gr-Gen unit grows clusters for both X and Z syndromes. Two or more Gr-Gen units use one DFS Engine module and two or more DFS Engines use one Corr Engine. These number of units to be shared may be determined by the fraction of the total execution time spent in each pipeline stage.

Below, the simulation infrastructure used to make design choices in the decoder microarchitecture is discussed. This infrastructure enables the estimation of some of the key statistics of the Union-Find decoder and further enables the study of the performance of the compression techniques described herein.

Figure 23:
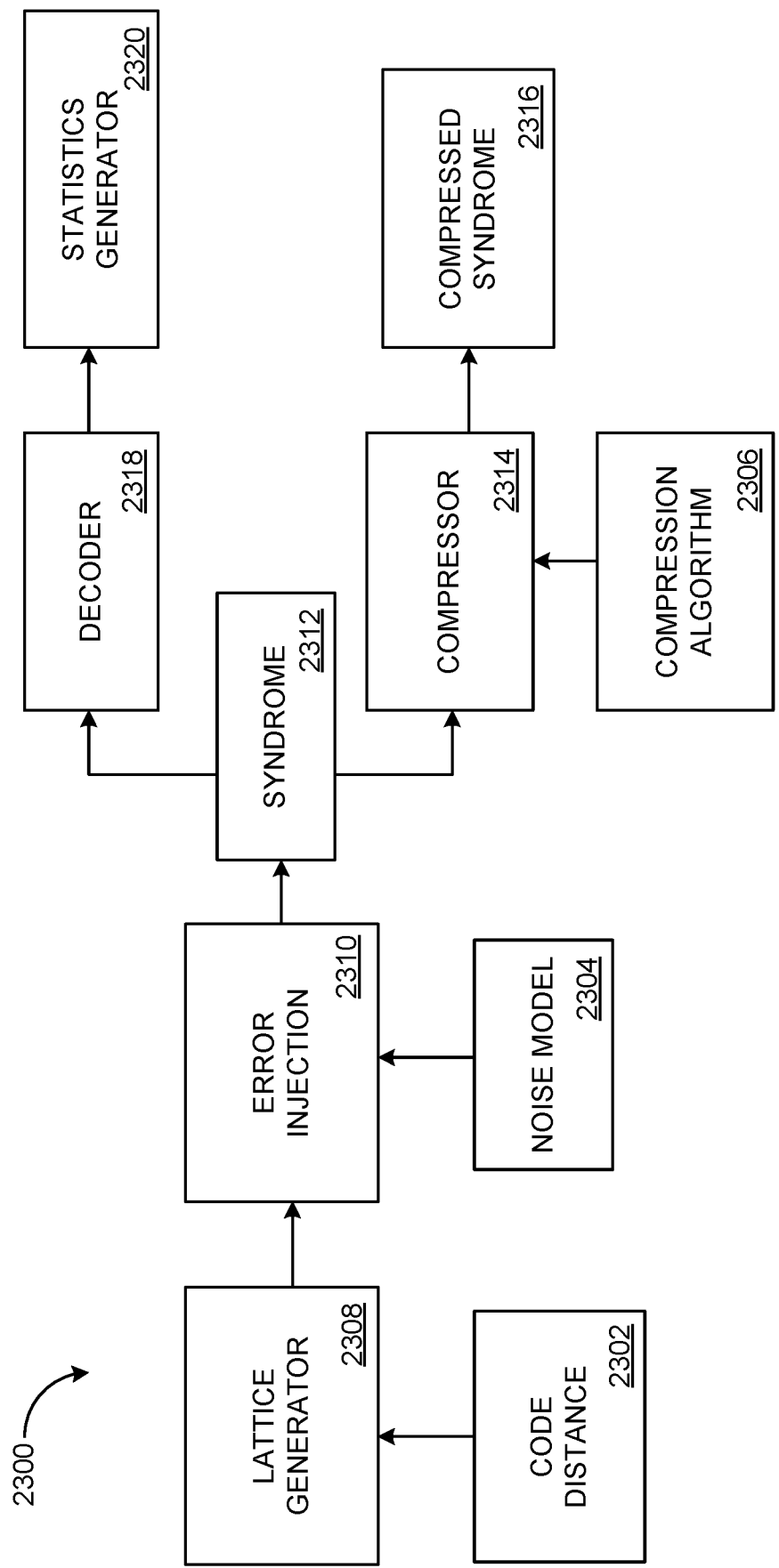
FIG. 23 schematically shows a Monte Carlo simulator framework.

A Monte Carlo simulator was used to analyze the performance of different compression techniques and obtain statistics of the performance of the Union-Find decoder. FIG. 23 schematically shows a Monte Carlo simulator 2300. Different configurations spanning four different physical error rates, ten different code distances, and four noise models were each simulated for a million trials. The error rates chosen were $10^{-6}$ (most optimistic), $10^{-4}$, $10^{-3}$, and $10^{-2}$ (most pessimistic). Simulator 2300 accepted a code distance 2302, noise model 2304, and compression algorithm 2306. Based on the code distance 2302, the simulator 2300 generated a surface code lattice via lattice generator 2308. Depending upon the selected noise model 2304, the simulator injected errors via error injection 2310 on the data qubits of the surface code lattice and generated the output syndrome 2312. The output syndrome 2312 was then compressed via compressor 2314 in accordance with the input compression algorithm 2306 to generate compressed syndrome 2316. Simulator 2300 then output a compression ratio. As a figure-of-merit to determine the most suitable compression scheme, compression ratio (determined by Equation (9)) and percentage of incompressible syndromes were used. The simulation was repeated a million times to compute the average compression ratio and percentage of incompressible syndromes.

$$\text{Compression Ratio} = \frac{\text{Compressed Syndrome Length}}{\text{Actual Syndrome Length}} \tag{Eq. 9}$$

The simulator also ran the Union-Find decoding algorithm on syndrome 2312 via decoder 2318. Statistics generator 2320 then analyzed the distribution of cluster sizes, average number of clusters on a given lattice, and execution time spent in each pipeline stage of decoder 2318 by modeling the hardware. These statistics and performance numbers provided insights that contributed to the design of the micro-architecture of the hardware implementation of the decoder and motivated the scalable design.

The performance of a decoder depends heavily on the noise model of the underlying qubits. Thus, four different error models were explored. Identical and independently distributed (iid) errors were assumed, and the depolarizing noise model was chosen as the most basic noise model. In the depolarizing noise model, if the error rate is p, each physical qubit encounters an error with probability p and remains error free with probability (1−p). Additionally, in this error model, X, Y, and Z errors each occur with equal probabilities p/3. The other three noise models assume different probabilities of X and Z errors as shown in Table 2.

TABLE 2

| Model | Error Probabilities | | |
|---|---|---|---|
| | X Error ($P_x$) | Z Error ($P_z$) | Y Error ($P_y$) |
| Depolarizing | p/3 | p/3 | p/3 |
| $P_x = P_z$ | p/2 | p/2 | 0 |
| $P_x = 10P_z$ | p/11 | 10p/11 | 0 |
| $P_x = 100P_z$ | p/101 | 100p/101 | 0 |

Results for syndrome compression, the baseline Union-Find decoder design and scalability analysis are discussed herein. Results for the baseline decoder and scalability analysis are based on d (code distance) rounds of syndrome measurements as described herein.

Performance of each compression scheme depends on the noise model. For the depolarizing noise model, compression schemes like DZC and Geo-Comp offer better performance as compared to sparse representation for low code distances depending upon the error rate. DZC works better than Geo-Comp for noise models which have a relative bias for a specific type of error such as $P_x=10P_z$ and $P_x=100P_z$. For lower code distances, even though sparse representation offers a higher compression ratio, the percentage of incompressible syndromes is higher (up to 6%) for large error rates. For noise models where probability of one type of error is much larger than the other type, better compression ratio is obtained by compressing X and Z syndromes separately at the expense of greater hardware complexity. If only one type of compression must be used owing to hardware restrictions, for lower code distances, DZC performs better. Table 3 specifies the different noise regimes and the appropriate compression scheme that works best in each regime. Overall, for most cases in the regime of low error rates, sparse representation performs better.

TABLE 3

| Model | Error Rate | Compression Scheme | | |
|---|---|---|---|---|
| | | DZC | Sparse | Geo-Comp |
| Depolarizing | $10^{-5}$ | — | $d \geq 7$ | $d = 3, 5$ |
| | $10^{-4}, 10^{-3}, 10^{-2}$ | $d = 3$ | $d \geq 7$ | $d = 5$ |
| $P_x = P_z$ | $10^{-5}, 10^{-4}, 10^{-3}, 10^{-2}$ | — | $d \geq 5$ | $d = 3$ |
| $P_x = 10P_z$ | $10^{-5}, 10^{-4}$ | $d = 3$ | $d \geq 5$ | — |
| | $10^{-3}, 10^{-2}$ | $d = 3, 5$ | $d \geq 7$ | — |
| $P_x = 100P_z$ | $10^{-5}, 10^{-4}, 10^{-3}, 10^{-2}$ | $d = 3$ | $d \geq 5$ | — |

Figure 24:
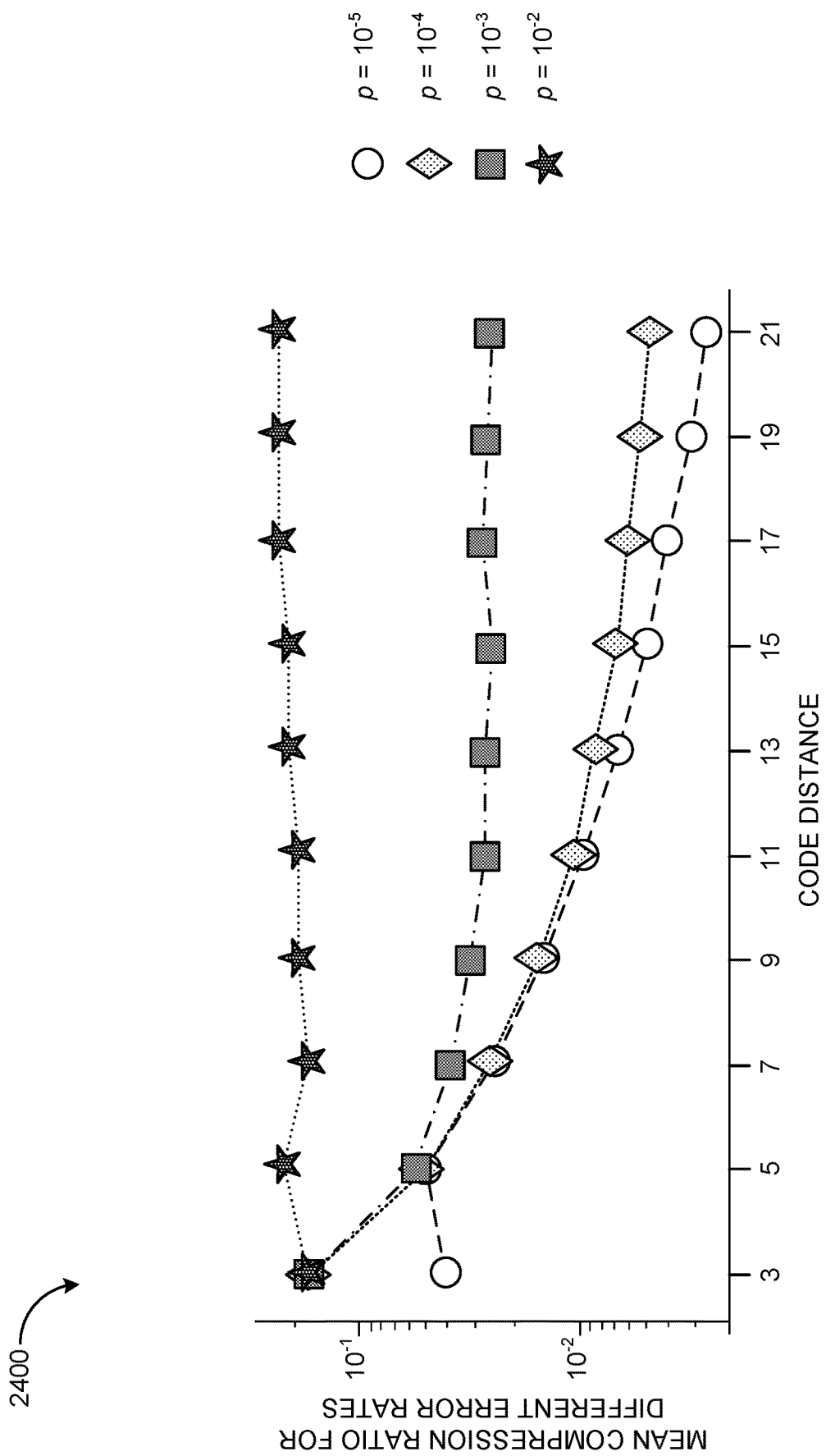
FIG. 24 is a plot indicating mean compression ratios for different error rates across code distances.

FIG. 24 shows a plot 2400 indicating the mean compression ratio of the X syndromes for the depolarizing noise channel using a selected compression scheme for different physical error rates and noise regimes. The depolarizing noise channel is shown as a representative candidate. Similar results were observed for the Z syndromes.

Figure 25:
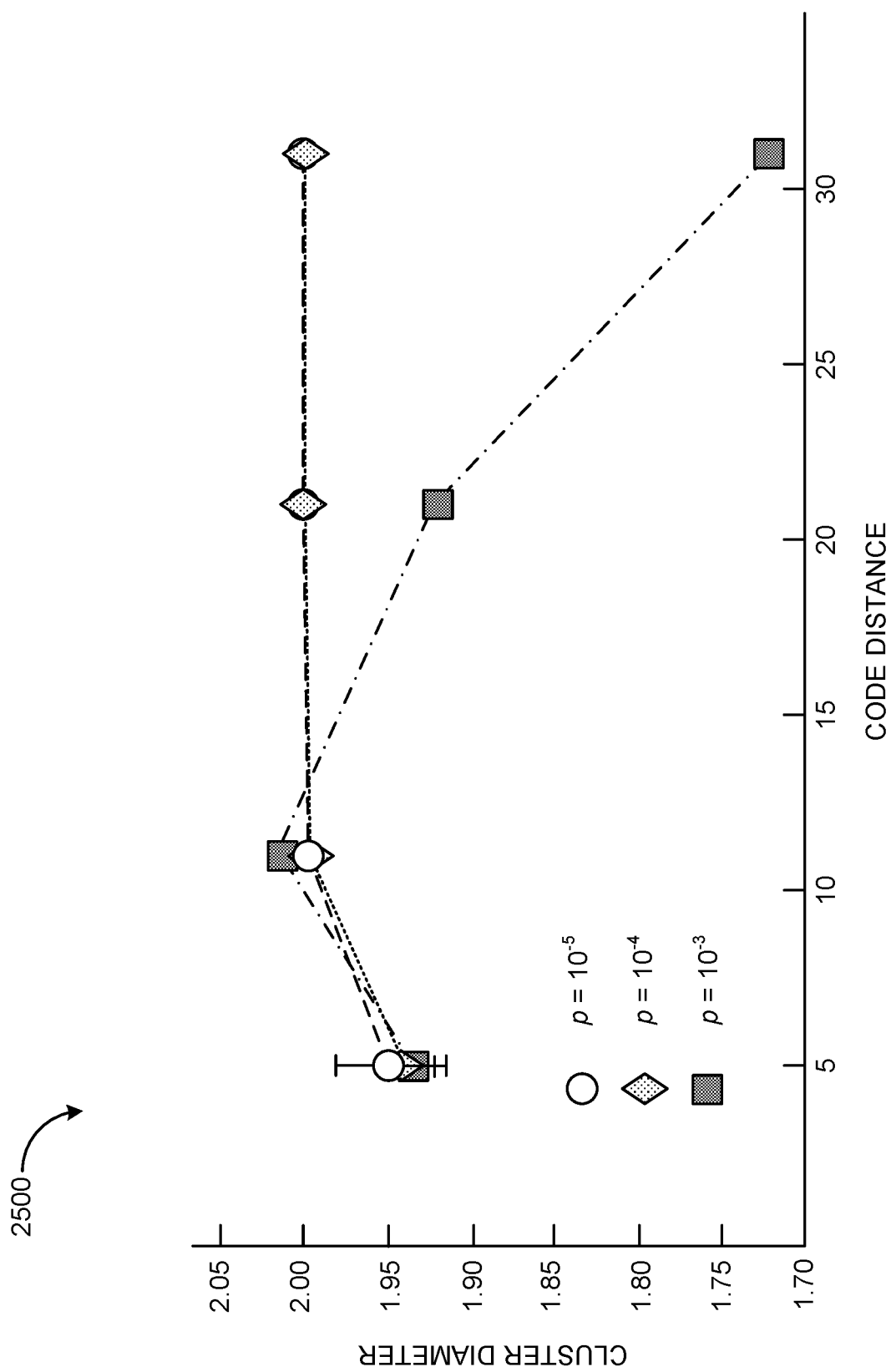
FIG. 25 is a plot indicating average cluster diameter for different error rates and code distance for a logical qubit.

The distribution of the diameter of clusters from the simulations was determined. As defined herein, cluster diameter is the maximum distance between any two boundary vertices of a cluster. FIG. 25 shows a plot 2500 indicating an average cluster diameter for different error rates and code distance for a logical qubit. The average cluster diameter is low. This result is used to eliminate the storage costs incurred in maintaining the boundary list for each cluster in hardware, a feature that is used in the original Union-Find algorithm. This reduces the hardware cost of the Gr-Gen modules. The probability that a clusters diameter will be small increases with decreasing error rates.

Figure 26:
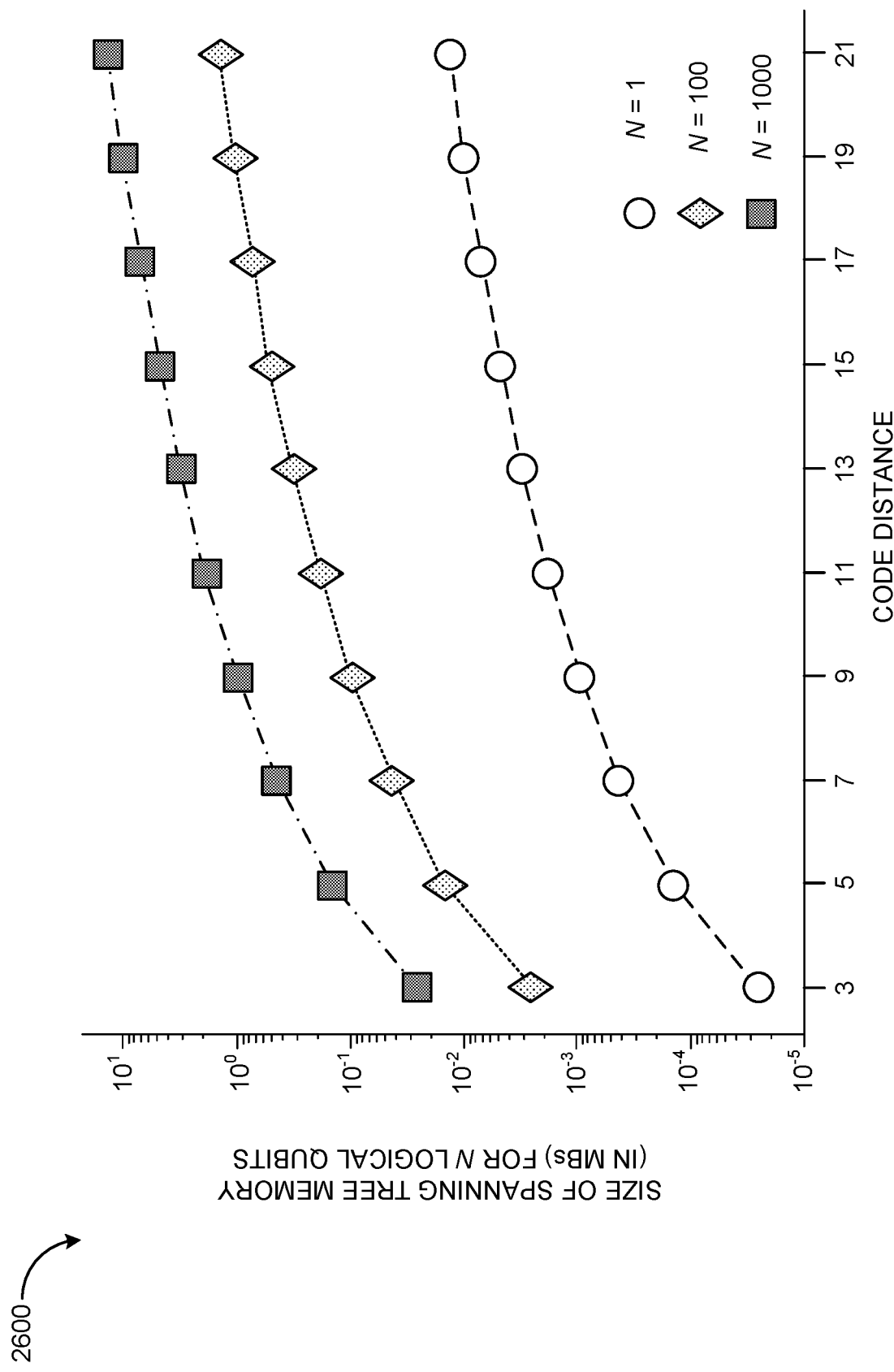
FIG. 26 is a plot indicating total memory capacity required for implementing Spanning Tree Memory.

The spanning tree memory (STM) used by the Gr-Gen modules and DFS engines accounts for most of the storage costs. FIG. 26 shows a plot 2600 indicating total memory capacity required for the Spanning Tree Memory (STM) for a given code distance (d) and number of logical qubits (N). The results shown here are for 3D graphs constructed using d rounds of measurements. Plot 2600 shows that even for a large number of logical qubits such as 1000, the total memory required to decode both X and Z syndromes is less than 10 MBs for very large code distances (d) and d rounds of measurements. If the decoder does not need to account for d rounds of measurements (assuming perfect measurements are possible in future), the total memory capacity required is reduced by a factor of d.

The maximum number of entries possible for the root and size tables is the total number of syndrome bits (equals to $2d(d-1)$) for d (code distance) rounds of syndrome measurements. Each root table entry includes a root which can be uniquely identified using $\log_2 2d^2(d-1)$ bits. Similarly, the largest size of a cluster feasible includes all the syndrome bits. Thus, the total size of the root and size table is $2d^2(d-1) \log_2 2d^2(d-1)$ bits for each logical qubit.

Figure 27:
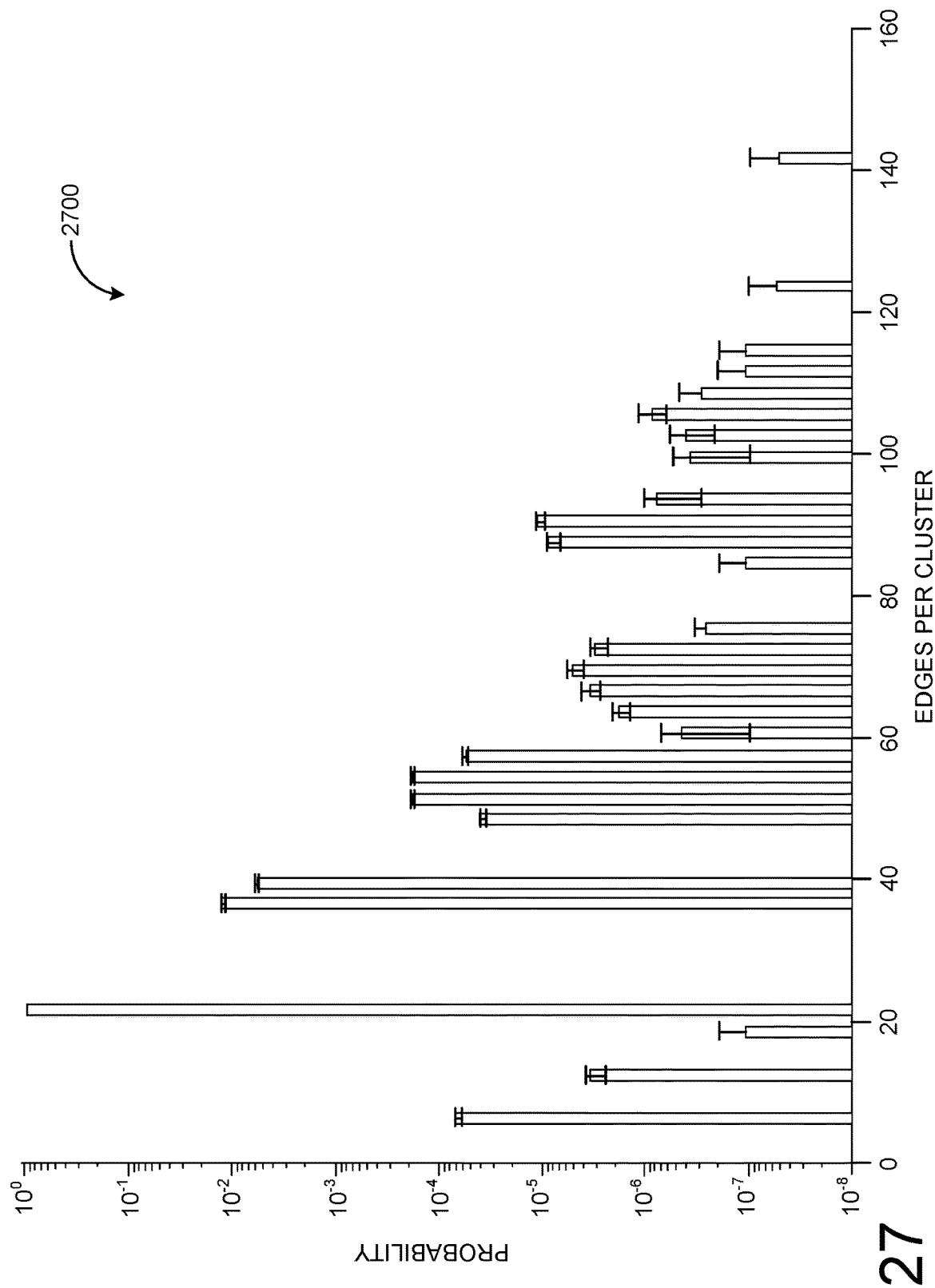
FIG. 27 is a plot indicating a distribution of a number of edges in a cluster for a fixed code distance and physical error rate.
Figure 28:
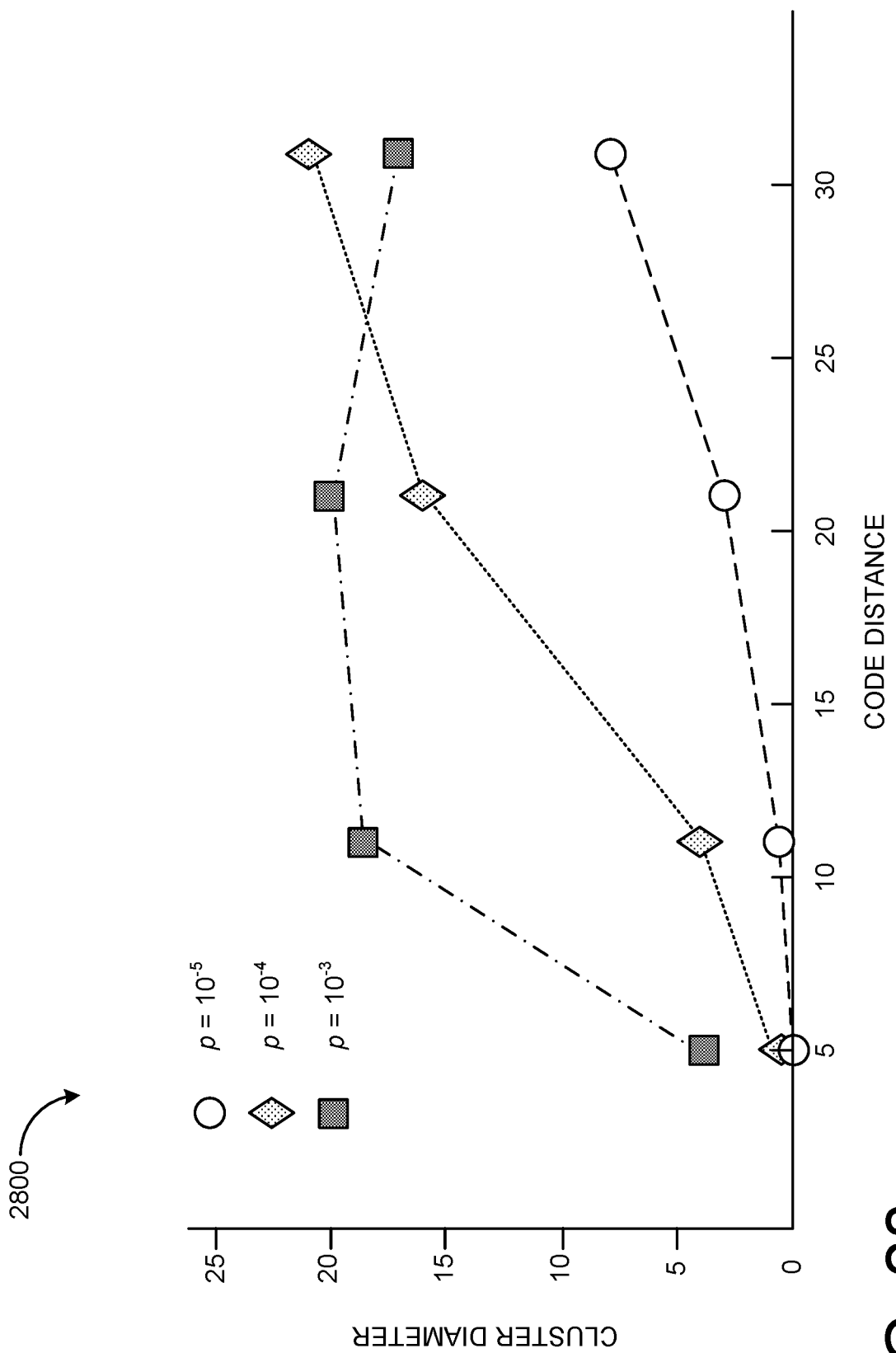
FIG. 28 is a plot showing an average number of edges in a cluster for different code distances and error rates.

The size of the stacks may be determined by analyzing the maximum number of edges within a cluster from the Monte Carlo simulations. The number of edges in a cluster follows Poisson distribution. FIG. 27 shows an example plot 2700 indicating such a distribution for code distance d=11 and physical error rate $p=10^{-3}$. The stack size may thus be designed to be half the maximum number of edges. FIG. 28 is a plot 2800 showing an average number of edges in a cluster for different code distances and error rates. Each stack stores two vertices ($\log_2 4d^2(d-1)$bits), direction of growth (2 bits), and 1 bit of syndrome. It is notable that each DFS engine comprises 2 stacks for pipelining. If the size of a cluster is larger than what each stack can hold, an overflow bit may be set and the alternate stack may be used when available.

Figure 20:
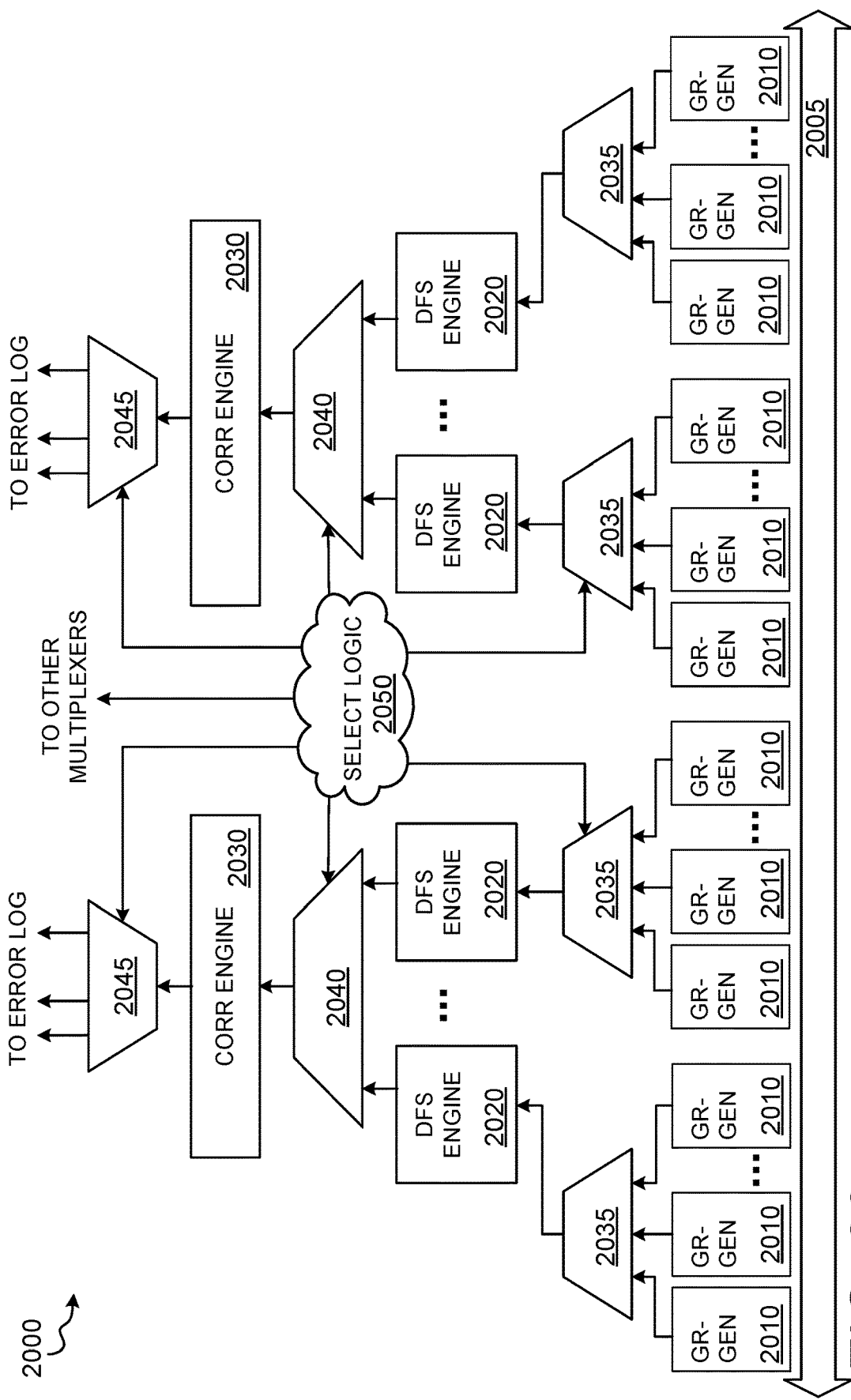
FIG. 20 shows an example design for a decoder block.
Figure 29:
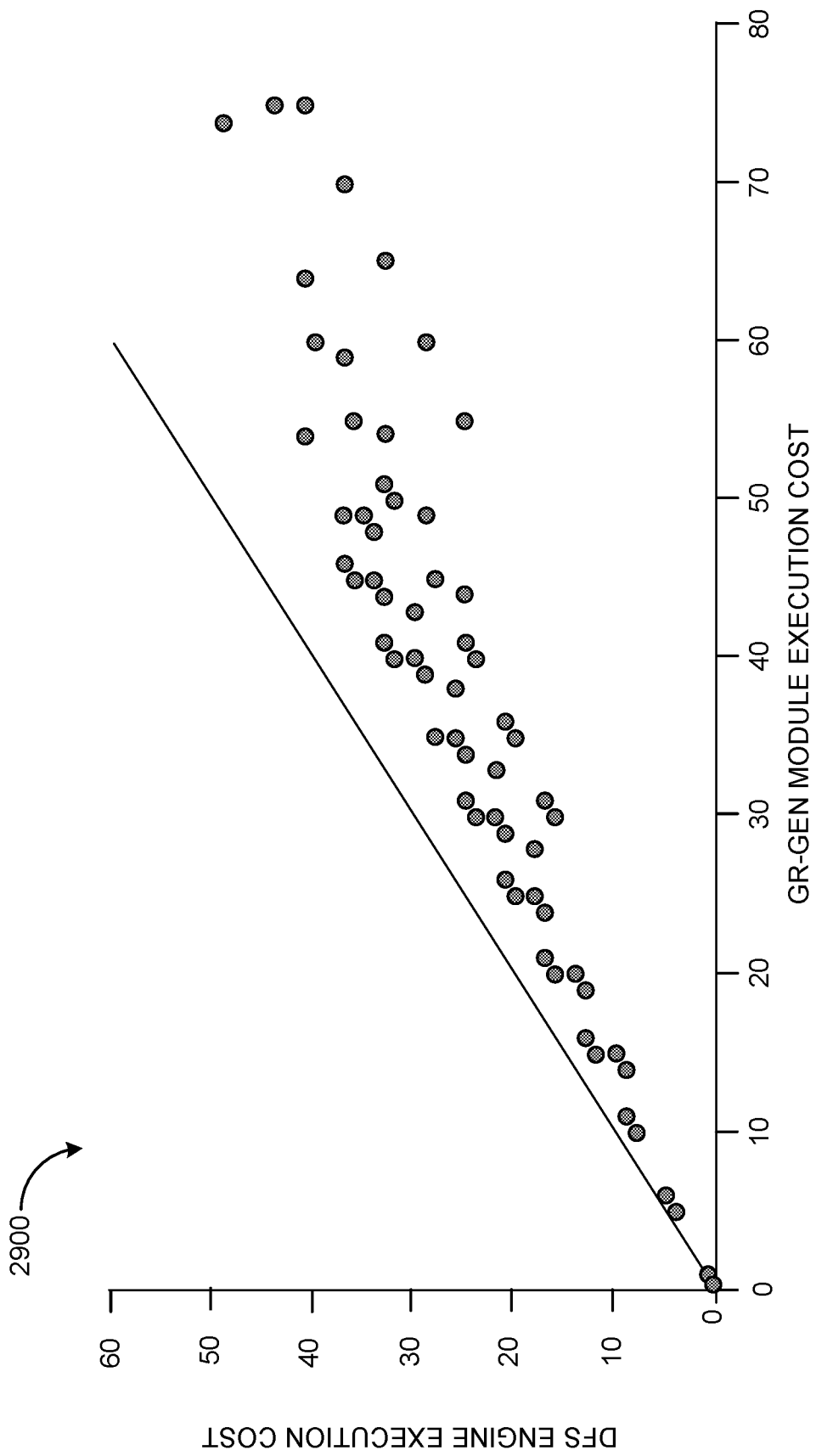
FIG. 29 is a plot indicating the correlation between the execution times in the Graph Generator Module and Depth First Search Engine.
Figure 30:
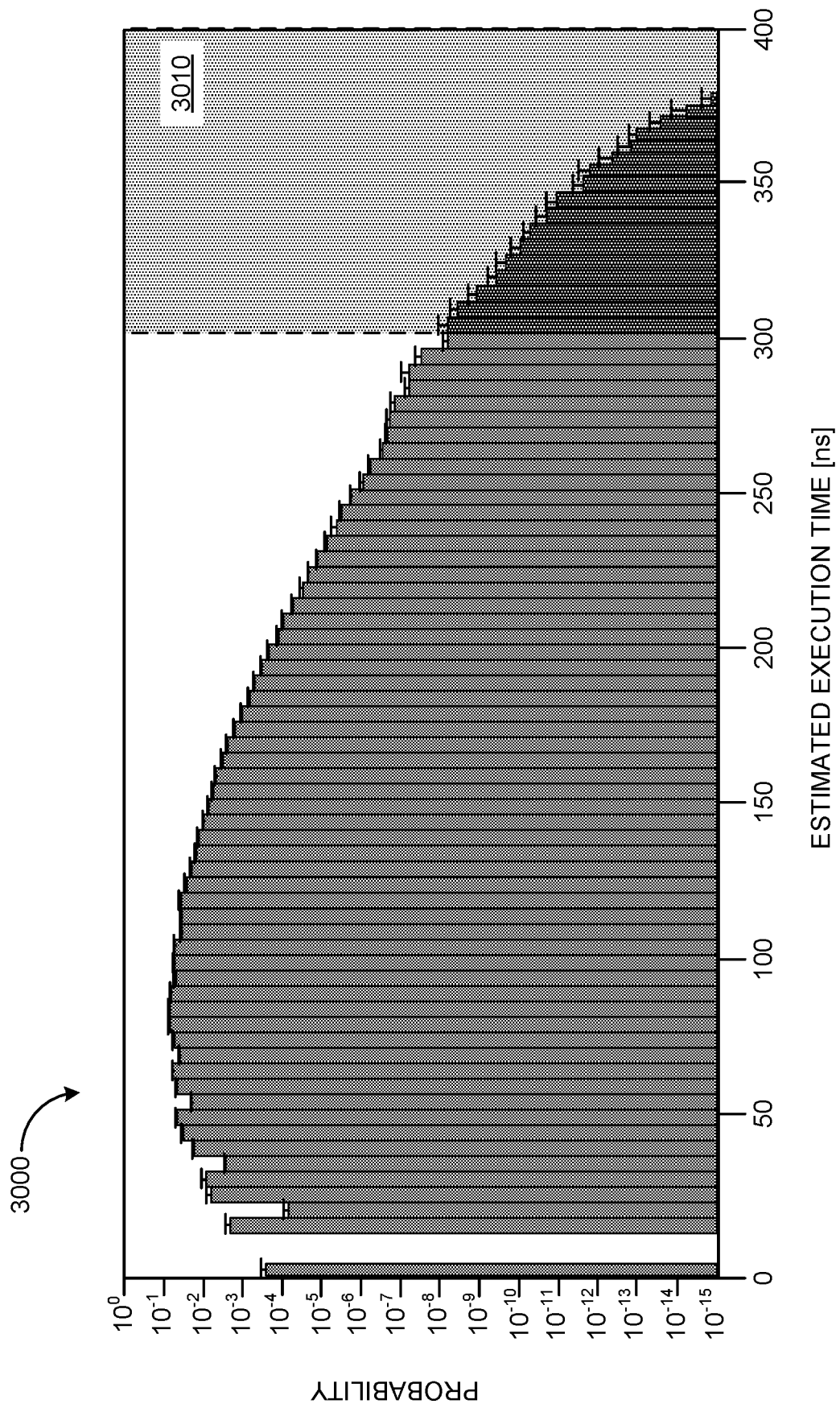
FIG. 30 is a plot indicating a distribution of execution time for decoding 3D graphs

FIG. 29 shows a plot 2900 indicating the correlation between the execution times in the Gr-Gen and DFS Engine. This implies that during decoding, more time is spent in the Gr-Gen unit. This data is used to select the number of resources to be shared within a decoder block as described herein. FIG. 30 shows a plot 3000 indicating the distribution of execution time for a single decoder block (e.g., as shown in FIG. 20) for a code distance (d) of 11 and error rate (p) $0.5 \times 10^{-3}$. The shaded region indicates events that may lead to an increased probability of a timeout failure. With the implemented sharing of resources, the probability of a timeout failure $p_{tof}$ is lower than the probability of a logical error rate is $10^{-8}$. For L logical qubits, the number of Gr-Gen modules, DFS Engines, and Corr Engines utilized are L, L|2, and L|2 respectively in this architecture. Thus, the total number of Gr-Gen modules, DFS Engines, and Corr Engines are reduced by 2×, 4×, and 4× respectively.

Error correction is an integral part of the classical computation associated with a quantum computer. Error decoding algorithms are designed to attain higher error correction capabilities (thresholds). Herein, a micro-architecture of a hardware implementation of the Union-Find decoder is disclosed using CMOS for operation at 77 K. Syndrome compression is feasible in order to meet the bandwidth requirements of the 4 K-77 K links. Different compression schemes work differently under different noise regimes, with sparse data representation usually working better for lower error rates and larger code distances. The disclosed micro-architecture is designed keeping in mind that decoders need to scale up to a few thousand logical qubits. The architecture comprises three pipeline stages and is tuned for high performance and throughput and low hardware complexity. The design may be scaled for a larger number of logical qubits for practical fault-tolerant quantum computation. The time spent in each pipeline stage is different and thus the utilization of each stage varies. By taking this into account, an architecture is disclosed that relies on resource sharing across multiple logical qubits. Such resource sharing is enabled such that the logical error rate is unaffected and the system failure rate due to its inability to decode errors owing to lack of decoding resources is minimized.

In some embodiments, the methods and processes described herein may be tied to a computing system of one or more computing devices. In particular, such methods and processes may be implemented as a computer-application program or service, an application-programming interface (API), a library, and/or other computer-program product.

Figure 31:
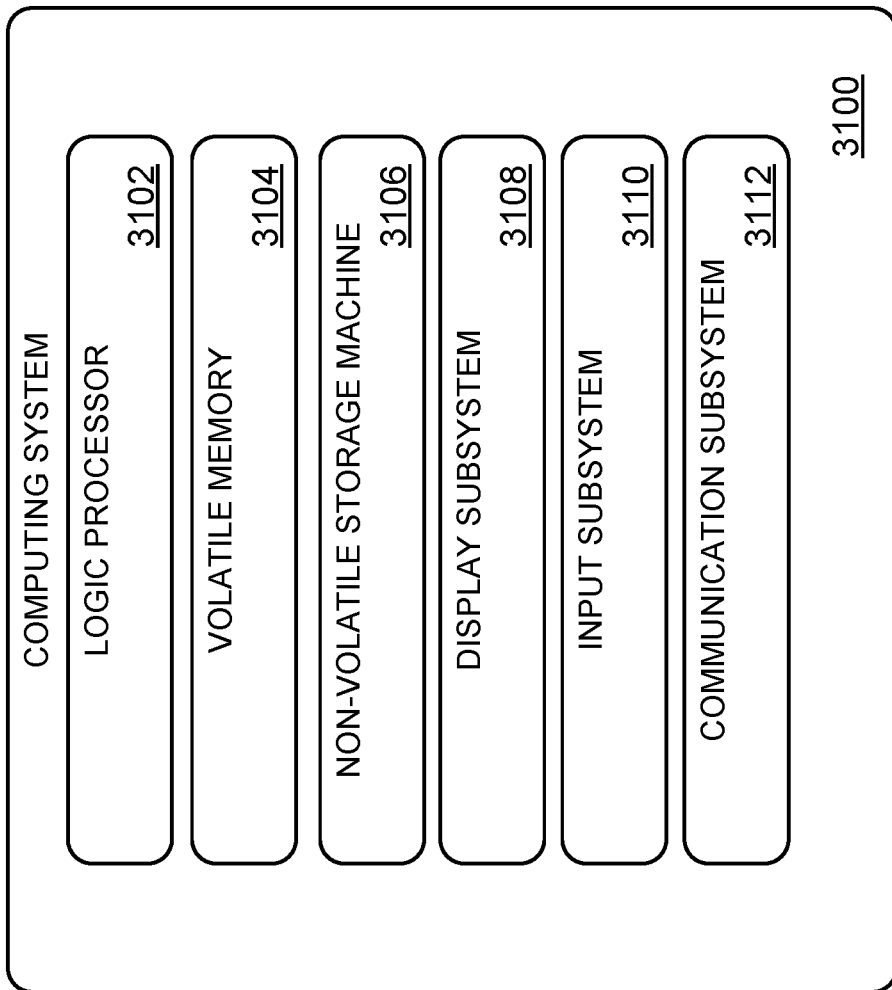
FIG. 31 shows a schematic view of an example classical computing device.

FIG. 31 schematically shows a non-limiting embodiment of a computing system 3100 that can enact one or more of the methods and processes described above. Computing system 3100 is shown in simplified form. Computing system 3100 may embody the host computer device described above and illustrated in FIG. 1. Computing system 3100 may take the form of one or more personal computers, server computers, tablet computers, home-entertainment computers, network computing devices, gaming devices, mobile computing devices, mobile communication devices (e.g., smart phone), and/or other computing devices, and wearable computing devices such as smart wristwatches and head mounted augmented reality devices.

Computing system 3100 includes a logic processor 3102 volatile memory 3104, and a non-volatile storage device 3106. Computing system 3100 may optionally include a display subsystem 3108, input subsystem 3110, communication subsystem 3112, and/or other components not shown in FIG. 31.

Logic processor 3102 includes one or more physical devices configured to execute instructions. For example, the logic processor may be configured to execute instructions that are part of one or more applications, programs, routines, libraries, objects, components, data structures, or other logical constructs. Such instructions may be implemented to perform a task, implement a data type, transform the state of one or more components, achieve a technical effect, or otherwise arrive at a desired result.

The logic processor may include one or more physical processors (hardware) configured to execute software instructions. Additionally or alternatively, the logic processor may include one or more hardware logic circuits or firmware devices configured to execute hardware-implemented logic or firmware instructions. Processors of the logic processor 3102 may be single-core or multi-core, and the instructions executed thereon may be configured for sequential, parallel, and/or distributed processing. Individual components of the logic processor optionally may be distributed among two or more separate devices, which may be remotely located and/or configured for coordinated processing. Aspects of the logic processor may be virtualized and executed by remotely accessible, networked computing devices configured in a cloud-computing configuration. In such a case, these virtualized aspects are run on different physical logic processors of various different machines, it will be understood.

Non-volatile storage device 3106 includes one or more physical devices configured to hold instructions executable by the logic processors to implement the methods and processes described herein. When such methods and processes are implemented, the state of non-volatile storage device 3106 may be transformed—e.g., to hold different data.

Non-volatile storage device 3106 may include physical devices that are removable and/or built-in. Non-volatile storage device 3106 may include optical memory (e.g., CD, DVD, HD-DVD, Blu-Ray Disc, etc.), semiconductor memory (e.g., ROM, EPROM, EEPROM, FLASH memory, etc.), and/or magnetic memory (e.g., hard-disk drive, floppy-disk drive, tape drive, MRAM, etc.), or other mass storage device technology. Non-volatile storage device 3106 may include nonvolatile, dynamic, static, read/write, read-only, sequential-access, location-addressable, file-addressable, and/or content-addressable devices. It will be appreciated that non-volatile storage device 3106 is configured to hold instructions even when power is cut to the non-volatile storage device 3106.

Volatile memory 3104 may include physical devices that include random access memory. Volatile memory 3104 is typically utilized by logic processor 3102 to temporarily store information during processing of software instructions. It will be appreciated that volatile memory 3104 typically does not continue to store instructions when power is cut to the volatile memory 3104.

Aspects of logic processor 3102, volatile memory 3104, and non-volatile storage device 3106 may be integrated together into one or more hardware-logic components. Such hardware-logic components may include field-programmable gate arrays (FPGAs), program- and application-specific integrated circuits (PASIC/ASICs), program- and application-specific standard products (PSSP/ASSPs), system-on-a-chip (SOC), and complex programmable logic devices (CPLDs), for example.

When included, display subsystem 3108 may be used to present a visual representation of data held by non-volatile storage device 3106. The visual representation may take the form of a graphical user interface (GUI). As the herein described methods and processes change the data held by the non-volatile storage device, and thus transform the state of the non-volatile storage device, the state of display subsystem 3108 may likewise be transformed to visually represent changes in the underlying data. Display subsystem 3108 may include one or more display devices utilizing virtually any type of technology. Such display devices may be combined with logic processor 3102, volatile memory 3104, and/or non-volatile storage device 3106 in a shared enclosure, or such display devices may be peripheral display devices.

When included, input subsystem 3110 may comprise or interface with one or more user-input devices such as a keyboard, mouse, touch screen, or game controller. In some embodiments, the input subsystem may comprise or interface with selected natural user input (NUI) componentry. Such componentry may be integrated or peripheral, and the transduction and/or processing of input actions may be handled on- or off-board. Example NUI componentry may include a microphone for speech and/or voice recognition; an infrared, color, stereoscopic, and/or depth camera for machine vision and/or gesture recognition; a head tracker, eye tracker, accelerometer, and/or gyroscope for motion detection and/or intent recognition; as well as electric-field sensing componentry for assessing brain activity; and/or any other suitable sensor.

When included, communication subsystem 3112 may be configured to communicatively couple various computing devices described herein with each other, and with other devices. Communication subsystem 3112 may include wired and/or wireless communication devices compatible with one or more different communication protocols. As non-limiting examples, the communication subsystem may be configured for communication via a wireless telephone network, or a wired or wireless local- or wide-area network, such as a HDMI over Wi-Fi connection. In some embodiments, the communication subsystem may allow computing system 3100 to send and/or receive messages to and/or from other devices via a network such as the Internet.

In one example, a quantum computing device comprises at least one quantum register including l logical qubits, where l is a positive integer; and a set of d decoder blocks coupled to the at least one quantum register, where d<2*l. In such an example, or any other example, each decoder block is additionally or alternatively configured to receive decoding requests from a set of n logical qubits, wherein n>1. In any of the preceding examples, or any other example, each decoder block additionally or alternatively comprises g Graph Generator (Gr-Gen) modules, where $0<g\leq l$. In any of the preceding examples, or any other example, each decoder block additionally or alternatively comprises $\alpha*$/Depth First Search (DFS) engines, where $0<\alpha<1$. In any of the preceding examples, or any other example, two or more Gr-Gen modules are additionally or alternatively coupled to each DFS engine via one of a first set of multiplexers. In any of the preceding examples, or any other example, each decoder block additionally or alternatively comprises $\beta*$/Correction (Corr) engines, where $0<\beta<1$. In any of the preceding examples, or any other example, two or more DFS engines are additionally or alternatively coupled to each Corr engine via one of a second set of multiplexers. In any of the preceding examples, or any other example, memory requests generated by each Corr engine are additionally or alternatively routed to memory locations via one or more demultiplexers. In any of the preceding examples, or any other example, return signals are additionally or alternatively routed through each multiplexer of the first and second sets of multiplexers based on round-robin arbitration.

In another example, a method for a quantum computing device comprises generating syndromes from at least one quantum register including l logical qubits, where l is a positive integer; and routing the generated syndromes to a set of d decoder blocks coupled to the at least one quantum register, where d<2*l. In such an example, or any other example, each decoder block is additionally or alternatively configured to receive decoding requests from a set of n logical qubits, wherein n>1. In any of the preceding examples, or any other example, each decoder block additionally or alternatively comprises g Graph Generator (Gr-Gen) modules, where 0<g<l, each Gr-Gen module configured to generate spanning tree memory (STM) data based on the received syndromes. In any of the preceding examples, or any other example, each decoder block additionally or alternatively comprises α*l Depth First Search (DFS) engines, where 0<α<1. In any of the preceding examples, or any other example, the method additionally or alternatively comprises at each DFS engine, accessing, via one of a first set of multiplexers, STM data generated by two or more Gr-Gen modules; and generating edge stacks based on the STM data.

In any of the preceding examples, or any other example, each decoder block additionally or alternatively comprises β*l Correction (Corr) engines, where 0<β<1. In any of the preceding examples, or any other example, the method additionally or alternatively comprises at each Corr engine, accessing, via one of a second set of multiplexers, edge stacks generated by two or more DFS engines; and generating memory requests based on the accessed edge stacks. In any of the preceding examples, or any other example, the method additionally or alternatively comprises routing memory requests generated by each Corr engine to memory locations via one or more demultiplexers. In any of the preceding examples, or any other example, the method additionally or alternatively comprises routing return signals through each multiplexer of the first and second sets of multiplexers based on round-robin architecture.

In yet another example, a quantum computing device comprises at least one quantum register including l logical qubits, where l is a positive integer; and a set of d decoder blocks coupled to the at least one quantum register, wherein d<2*l, and each decoder block comprises: g Graph Generator (Gr-Gen) modules, where 0<g<l, each Gr-Gen module configured to generate spanning tree memory (STM) data based on syndromes received from two or more of the l logical qubits; α*l Depth First Search (DFS) engines, where 0<α<1, and each DFS engine is configured to: access, via one of a first set of multiplexers, STM data generated by two or more Gr-Gen generators; and generate edge stacks based on the STM data; and β*l Correction (Corr) engines, where 0<β<1, and each Corr engine is configured to: access, via one of a second set of multiplexers, edge stacks generated by two or more DFS engines; generate memory requests based on the accessed edge stacks; and route the generated memory requests to memory locations via one or more demultiplexers. In such an example, or any other example, the quantum computing device additionally or alternatively comprises a compression engine coupled to each logical qubit, the compression engine configured to compress syndrome data; and a decompression engine coupled to each compression engine, each decompression engine configured to: receive compressed syndrome data; decompress the received compressed syndrome data; and route the decompressed syndrome data to a decoder of the set of d decoder blocks.

It will be understood that the configurations and/or approaches described herein are exemplary in nature, and that these specific embodiments or examples are not to be considered in a limiting sense, because numerous variations are possible. The specific routines or methods described herein may represent one or more of any number of processing strategies. As such, various acts illustrated and/or described may be performed in the sequence illustrated and/or described, in other sequences, in parallel, or omitted. Likewise, the order of the above-described processes may be changed.

The subject matter of the present disclosure includes all novel and non-obvious combinations and sub-combinations of the various processes, systems and configurations, and other features, functions, acts, and/or properties disclosed herein, as well as any and all equivalents thereof.

The invention claimed is:

1. A quantum computing device, comprising:
    at least one quantum register including l logical qubits, where l is a positive integer, and where each of the l logical qubits generates syndromes including at least X syndromes and Z syndromes; and
    a set of d decoder blocks coupled to the at least one quantum register, where d<2*l, such that fewer than 2 decoder blocks are used to process each syndrome generated by the l logical qubits and to output error estimations for data qubits of the l logical qubits; and
    wherein each decoder block comprises g Graph Generator (Gr-Gen) modules, where 0<g<l.

2. The quantum computing device of claim 1, wherein each decoder block is configured to receive decoding requests from a set of n logical qubits, wherein n>1.

3. The quantum computing device of claim 1, wherein each decoder block further comprises α*l Depth First Search (DFS) engines, where 0<α<1.

4. The quantum computing device of claim 3, wherein two or more Gr-Gen modules are coupled to each DFS engine via one of a first set of multiplexers.

5. The quantum computing device of claim 4, wherein each decoder block further comprises β*l Correction (Corr) engines, where 0<β<1.

6. The quantum computing device of claim 5, wherein two or more DFS engines are coupled to each Corr engine via one of a second set of multiplexers.

7. The quantum computing device of claim 5, wherein memory requests generated by each Corr engine are routed to memory locations via one or more demultiplexers.

8. The quantum computing device of claim 5, wherein return signals are routed through each multiplexer of the first and second sets of multiplexers based on round-robin arbitration.

9. A method for a quantum computing device, comprising:
    generating syndromes from at least one quantum register including l logical qubits, where l is a positive integer, and where each of the generated syndromes includes at least X syndromes and Z syndromes; and
    routing the generated syndromes to a set of d decoder blocks coupled to the at least one quantum register, wherein each decoder block comprises kr Graph Generator (Gr-Gen) modules, where $0<g\leq 1$, and where $d<2*l$, such that fewer than 2 decoder blocks are used to process each generated syndrome and to output error estimations for data qubits of the l logical qubits.

10. The method of claim 9, wherein each decoder block is configured to receive decoding requests from a set of n logical qubits, wherein n>1.

11. The method of claim 9, wherein each Gr-Gen module is configured to generate spanning tree memory (STM) data based on the received syndromes.

12. The method of claim 11, wherein each decoder block further comprises $\alpha*l$ Depth First Search (DFS) engines, where $0<\alpha<1$.

13. The method of claim 11, further comprising:
at each DFS engine, accessing, via one of a first set of multiplexers, STM data generated by two or more Gr-Gen modules; and
generating edge stacks based on the STM data.

14. The method of claim 13, wherein each decoder block further comprises $\beta*l$ Correction (Con) engines, where $0<\beta<1$.

15. The method of claim 14, further comprising
at each Con engine, accessing, via one of a second set of multiplexers, edge stacks generated by two or more DFS engines; and
generating memory requests based on the accessed edge stacks.

16. The method of claim 15, further comprising:
routing memory requests generated by each Con engine to memory locations via one or more demultiplexers.

17. The method of claim 15, further comprising:
routing return signals through each multiplexer of the first and second sets of multiplexers based on round-robin architecture.

18. A quantum computing device, comprising:
at least one quantum register including l logical qubits, where l is a positive integer; and
a set of d decoder blocks coupled to the at least one quantum register, wherein $d<2*l$, and each decoder block comprises:
g Graph Generator (Gr-Gen) modules, where $0<g\leq 1$, each Gr-Gen module configured to generate spanning tree memory (S TM) data based on syndromes received from two or more of the l logical qubits;
$\alpha*l$ Depth First Search (DFS) engines, where $0<\alpha<1$, and each DFS engine is configured to:
access, via one of a first set of multiplexers, STM data generated by two or more Gr-Gen generators; and
generate edge stacks based on the STM data; and
$\beta*l$ Correction (Con) engines, where $0<\beta<1$, and each Con engine is configured to:
access, via one of a second set of multiplexers, edge stacks generated by two or more DFS engines;
generate memory requests based on the accessed edge stacks; and
route the generated memory requests to memory locations via one or more demultiplexers.

19. The quantum computing device of claim 18, further comprising:
a compression engine coupled to each logical qubit, the compression engine configured to compress syndrome data; and
a decompression engine coupled to each compression engine, each decompression engine configured to:
receive compressed syndrome data;
decompress the received compressed syndrome data; and
route the decompressed syndrome data to a decoder of the set of d decoder blocks.

* * * * *